United States Patent
Sasaki et al.

(10) Patent No.: US 8,034,542 B2
(45) Date of Patent: Oct. 11, 2011

(54) CONDUCTIVE FILM AND MANUFACTURING METHOD THEREOF, AND TRANSPARENT ELECTROMAGNETIC SHIELDING FILM

(75) Inventors: Hirotomo Sasaki, Minami-Ashigara (JP); Jun Matsumoto, Minami-Ashigara (JP); Takayasu Yamazaki, Minami-Ashigara (JP); Akimitsu Haijima, Shizuoka (JP); Yoshihiro Fujita, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 379 days.

(21) Appl. No.: 12/294,859

(22) PCT Filed: Mar. 28, 2007

(86) PCT No.: PCT/JP2007/056733
§ 371 (c)(1), (2), (4) Date: Sep. 26, 2008

(87) PCT Pub. No.: WO2007/114196
PCT Pub. Date: Oct. 11, 2007

(65) Prior Publication Data
US 2010/0170710 A1    Jul. 8, 2010

(30) Foreign Application Priority Data

Mar. 28, 2006 (JP) ............................... P2006-088538
Jun. 16, 2006 (JP) ............................... P2006-167440

(51) Int. Cl.
- *G03F 7/00* (2006.01)
- *G03C 5/26* (2006.01)
- *G03C 1/00* (2006.01)
- *G03C 1/005* (2006.01)
- *G03C 1/06* (2006.01)

(52) U.S. Cl. ........ 430/311; 430/434; 430/496; 430/413; 430/416; 430/417; 430/315; 430/567; 430/566; 430/607; 430/611; 430/640

(58) Field of Classification Search .................. 430/496, 430/413, 416, 417, 434, 524, 567, 566, 607, 430/611, 640
See application file for complete search history.

(56) References Cited

U.S. PATENT DOCUMENTS 7,682,774 B2 * 3/2010 Kim et al. .................. 430/281.1
7,749,686 B2 * 7/2010 Ichiki et al. .................. 430/311
(Continued)

FOREIGN PATENT DOCUMENTS

EP    1111982 A1    6/2001
(Continued)

OTHER PUBLICATIONS

Machine translation of JP2004-145063(no date).*
(Continued)

*Primary Examiner* — Amanda C. Walke
(74) *Attorney, Agent, or Firm* — Sughrue Mion, PLLC

(57) ABSTRACT

An electromagnetic shielding film for plasma display which is excellent in electromagnetic shielding characteristics for effectively shielding electromagnetic waves, near infrared rays, stray light, external light, and the like and even when stored under a wet heat condition, is small in change of color tint and good in adhesion, with a blackening layer hardly peeled away, is provided by a transparent electromagnetic shielding film including a transparent support having thereon a conductive metal layer in a pattern-like state having an electromagnetic shielding ability and having a surface covered by a blackening layer, with the blackening layer made of an alloy of nickel and zinc in a nickel/zinc mass ratio of from 0.5 to 50.

15 Claims, 1 Drawing Sheet

U.S. PATENT DOCUMENTS

| | | | |
|---|---|---|---|
| 7,796,327 B2 * | 9/2010 | Sasaki | 359/360 |
| 7,829,270 B2 * | 11/2010 | Nakahira | 430/496 |
| 2006/0008745 A1 | 1/2006 | Sasaki et al. | |
| 2007/0141377 A1 | 6/2007 | Hanafusa | |
| 2007/0181326 A1 | 8/2007 | Naito et al. | |
| 2010/0190111 A1 * | 7/2010 | Ichiki et al. | 430/311 |
| 2010/0258752 A1 * | 10/2010 | Mochizuki et al. | 250/515.1 |

FOREIGN PATENT DOCUMENTS

| | | | |
|---|---|---|---|
| JP | 6-85417 A | | 3/1994 |
| JP | 11-266095 A | | 9/1999 |
| JP | 2000-221564 A | | 8/2000 |
| JP | 2000-223886 A | | 8/2000 |
| JP | 2002-9484 A | | 1/2002 |
| JP | 2003-51673 A | | 2/2003 |
| JP | 2004-145063 A | | 5/2004 |
| JP | 2004145063 A | * | 5/2004 |
| JP | 2004-241761 A | | 8/2004 |
| JP | 2004-256832 A | | 9/2004 |
| JP | 2004-320025 A | | 11/2004 |
| JP | 2006-12935 A | | 1/2006 |
| JP | 2006-74052 A | | 3/2006 |
| WO | 2004039137 A1 | | 5/2004 |
| WO | 2005/072040 A1 | | 8/2005 |
| WO | 2005/079130 A1 | | 8/2005 |
| WO | 2006/098335 A1 | | 9/2006 |

OTHER PUBLICATIONS

Notification of the First Office Action from the State Intellectual Property Office of P.R. China dated May 12, 2010, issued in counterpart Chinese Application No. 200780011048.0.

Database WP I Section Ch. week 200673, Thompson Scientific, London, GB; AN 2006-708778; XP002601967.

Extended European Search Report dated Oct. 1, 2010, issued by the European Patent Office in counterpart European Patent Application No. 07740171.9-2214.

Office Action dated May 31, 2011 in Japanese Patent Application No. 2007-082216.

Office Action dated Jun. 30, 2011 on Chinese Patent Application No. 200780011048.0.

* cited by examiner

CONDUCTIVE FILM AND MANUFACTURING METHOD THEREOF, AND TRANSPARENT ELECTROMAGNETIC SHIELDING FILM

TECHNICAL FIELD

The present invention relates to a conductive film and a method of manufacturing the same and to a transparent electromagnetic shielding film. Above all, the invention relates to a transparent and conductive electromagnetic shielding film for plasma display, which even when stored under a wet heat condition, is small in change of color tint and good in adhesion and which is prepared by applying a plating treatment.

BACKGROUND ART

In recent years, following an increase in utilization of various electrical equipment and electronic application equipment, electromagnetic interference (EMI) increases rapidly. It is pointed out that EMI not only becomes a cause of malfunction or interference of electronic or electric appliances but also gives health interference to an operator of such a device. For that reason, in electronic or electric appliances, it is required that the intensity of electromagnetic wave discharge is controlled within the standards or regulations.

For a countermeasure against the EMI, electromagnetic waves must be shielded. In order to achieve this, it is self-explanatory to utilize such properties of a metal that it does not penetrate electromagnetic waves therethrough. For example, there are employed a method of forming a casing by a metal material or a highly conductive material; a method of inserting a metal plate between a circuit board and a circuit board; and a method of covering a cable by a metallic foil. However, in CRT, PDP, etc., since an operator must recognize letters or the like displayed on a screen, the transparency of the display front face is required. According to all of the foregoing methods, the display front face often becomes opaque. Thus, these methods are often inadequate as an electromagnetic shielding method to be applied to display appliances.

In addition, since PDP emits large quantities of electromagnetic waves as compared with CRT, etc., it is required to have a stronger electromagnetic shielding ability. For example, in an optically transparent electromagnetic shielding material for CRT, if its surface resistivity value is not more than approximately 300 $\Omega$/sq, there is no hindrance. On the other hand, in an optically transparent electromagnetic shielding material for PDP, a surface resistivity value of not more than 2.5 $\Omega$/sq is required. In order to meet such a requirement of high conductivity, a method of applying an opening pattern by a photolithographic measure to a metal foil with sufficient conductivity is employed.

However, for example, a copper foil which becomes a material for forming the foregoing shielding layer has a metallic luster. Accordingly, there is involved a problem that not only light from the outside of the panel is reflected, whereby the contrast of the screen is deteriorated, but also the reflected color of the copper foil is viewed. Furthermore, there is involved a problem that light emitted within the screen is reflected, too, whereby the image display quality of the display panel is deteriorated.

In order to effectively prevent all of the reflection of emitted light within the screen and incident light from the outside and leakage of electromagnetic waves, it is known that blackening treatment of a shielding film such as a copper foil is effective.

In particular, as a blackening treated film of copper foil for plasma display panel, it is desired that the surface of the blackening treated film is uniform and free from or extremely low in the generation of streak unevenness; that etching properties are good; that discoloration with time is small; and that the blackening treated layer is hardly peeled away (excellent in adhesion).

Patent Document 1 discloses an electromagnetic shielding film for plasma display panel, which is provided with a black nickel plated layer containing from 500 to 20,000 $\mu g/dm^2$ (from 0.05 to 2 $g/m^2$) of zinc and from 100 to 500 $\mu g/dm^2$ (from 0.01 to 0.05 $g/m^2$) on a surface of a copper foil and describes that a surface of a blackening treated film is uniform and small in streak unevenness. Patent Document 2 discloses an electromagnetic shielding plate which is configured to stack successively a blackening layer, a conductive pattern layer and a blackening layer in this order. Though the electromagnetic shielding has a complicated configuration, the generation of moiré is prevented by stacking the blackening layers. Also, Patent Document 3 discloses a shielding material in which visibility is improved by blackening both surfaces and side faces of a metal layer pattern to control reflection of both outgoing light and incident light. In addition, Patent Document 4 discloses an electromagnetic shielding filter having an improved contrast ratio by controlling reflected light by a blackening layer formed on a surface of a conductive pattern. All of the blackening layers disclosed in Patent Documents 2 to 4 are formed by a mixed layer of nickel and zinc.

Also, Patent Document 5 mentions that when plating with zinc or a zinc alloy is applied onto a glossy surface of a copper foil for printed circuit and the surface is then treated with benzotriazole or a benzotriazole derivative, the adhesion of a resist during photolithography is improved. This patent document is characterized in that the zinc used herein is extremely thinly formed in a deposition amount of from 100 to 500 $\mu g/dm^2$ (from 0.01 to 0.05 $g/m^2$). If it is intended to apply this as an electromagnetic shielding film for PDP, discoloration with time is large, and therefore, such was problematic.

On the other hand, the development of technologies for forming a metallic conductive thin film on an insulator film with high productivity, such as an electromagnetic shielding film which is used in a flexible wiring plate to be used in electronic appliances or a plasma display is desired.

For example, Patent Document 6 discloses a method of manufacturing an electromagnetic shielding film by exposing and developing a photosensitive material containing a silver salt and further applying physical development or plating treatment to the developed silver. According to Patent Document 6 it is described that as compared with other systems, a fine line pattern can be precisely formed, thereby obtaining an excellent electromagnetic shielding film such that it is high in transparency and that it is able to be mass-produced inexpensively.

[Patent Document 1] JP-A-2004-145063
[Patent Document 2] JP-A-11-266095
[Patent Document 3] JP-A-2002-9484
[Patent Document 4] JP-A-2004-320025
[Patent Document 5] JP-A-6-85417
[Patent Document 6] JP-A-2004-221564

DISCLOSURE OF THE INVENTION

Problems that the Invention is to Solve

As demonstrated in the foregoing background art, in the electromagnetic shielding film to be applied in a plasma display panel, nevertheless the blackening treatment has been investigated and developed from the standpoint of ensuring the visibility, it is the present situation that necessary conditions of the blackening layer that the discoloration with time be small; that the layer be stiff and free from peeling; and that blackening is sufficient are not thoroughly satisfactory. Also, in the case of electroplating a mesh-like metal layer by applying the foregoing background art to achieve blackening treatment, there was involved a problem that a blackening treated metal mesh which is uniform and free from unevenness and defectives cannot be obtained.

In addition, in particular, the electromagnetic shielding layer is required to desirably have a function as a protective film of plasma display panel, an electromagnetic wave preventing function, a near infrared ray preventing function, a color tone compensation function, a stray light preventing function and an external light shielding function and simultaneously have the foregoing properties and characteristics of the blackening treated film. It may be said that there has hitherto been not provided a metal mesh for plasma display panel which is satisfactory with these functions.

In view of the foregoing problems, the invention has been made. An object of the invention is to provide an electromagnetic shielding film for plasma display which is excellent in electromagnetic shielding characteristics for effectively shielding electromagnetic waves, near infrared rays, stray light, external light, and the like and even when stored under a wet heat condition, is small in change of color taste and good in adhesion, with a blackening layer being hardly peeled away, and which is uniformly blackened without generating defects.

Another object of the invention is to provide an optically transparent electromagnetic shielding film which in addition to the foregoing performances, is inexpensive, high in light transmittance while keeping high productivity, improved in change of color taste and good in adhesion. Incidentally, it is also possible to use the optically transparent electromagnetic shielding film of the invention upon sticking to a window glass of house or factory or the like or upon sticking to a window glass of automobile. Furthermore, it is also possible to provide the optically transparent electromagnetic shielding film of the invention as other applications.

Means for Solving the Problems

The invention is as follows.

The transparent electromagnetic shielding film of the invention is a transparent electromagnetic shielding film comprising a transparent support and a conductive metal layer thereon in a pattern-like state having an electromagnetic shielding ability and having a surface covered by a blackening layer, wherein the subject blackening layer contains an alloy of nickel and zinc in a nickel/zinc mass ratio of from 0.5 to 50 (preferably from 0.8 to 20, and more preferably from 0.5 to 2.0).

It is preferable that a total amount of metals constituting the foregoing conductive metal layer is from 0.2 to 10.0 $g/m^2$.

It is preferable that a total sum of the foregoing alloy of nickel and zinc is from 0.06 to 5.0 $g/m^2$.

It is preferable that the foregoing conductive metal layer contains from 0.05 to 2.0 $g/m^2$ (preferably from 0.1 to 1.0 $g/m^2$) of silver and from 0.2 to 10 $g/m^2$ (preferably from 0.2 to 5.0, and more preferably from 1.0 to 4.0 $g/m^2$) of copper; and that the blackening layer contains from 0.06 to 2.0 $g/m^2$ (preferably from 0.08 to 1.0 $g/m^2$) of nickel and from 0.02 to 2.0 $g/m^2$ (preferably from 0.06 to 2.0 $g/m^2$, and more preferably from 0.08 to 1.0 $g/m^2$) of zinc.

It is preferable that the metal constituting the foregoing conductive metal layer is silver and/or copper.

It is preferable that the foregoing conductive metal layer is a two-layered configuration of a silver layer containing silver and a copper layer containing copper. At this time, the silver layer is formed on the support, and thereafter, the copper layer is formed on the silver layer. Examples of such a conductive metal layer include one including a developed silver layer formed by exposing and developing a silver salt photosensitive material having a silver salt-containing layer containing a silver salt on a support and a metal layer formed on the foregoing developed silver layer by electroplating. At this time, it is preferable that the developed silver layer is formed in a pattern-like state.

It is preferable that the foregoing transparent electromagnetic shielding film contains from 0.03 to 0.3 $g/m^2$ of at least one member selected from benzotriazole, a benzotriazole derivative and a mercapto based compound.

It is preferable that the foregoing transparent electromagnetic shielding film contains gelatin.

Also, the conductive film of the invention is a conductive film comprising a support film, a conductive metal layer formed on the foregoing support film and a blackening layer formed on the foregoing conductive metal layer, wherein the foregoing blackening layer contains nickel and zinc, with a mass ratio of nickel and zinc satisfying the following formula (1). Also, it is preferable that the conductive film of the invention employs each configuration of the foregoing transparent electromagnetic shielding film.

$$Ni:Zn=0.5:1 \text{ to } 50:1 \quad (1)$$

Also, the manufacturing method of the conductive film of the invention comprises a step of exposing and developing a silver salt photosensitive material having a support film and a silver salt-containing layer formed on the foregoing support film so as to form a metallic silver part, a plating step of plating the foregoing metallic silver part so as to form a plating layer, and a blackening-layer-forming step of forming a blackening layer having a mass ratio of nickel and zinc satisfying the following formula (1) on the foregoing plating layer by using a plating liquid containing nickel and zinc.

$$Ni:Zn=0.5:1 \text{ to } 50:1 \quad (1)$$

In the case of manufacturing the foregoing conductive film of the invention, by setting up a mass ratio of nickel and zinc in the plating liquid at the blackening-layer-forming step such that the mass ratio of nickel and zinc of the resulting blackening layer falls within the foregoing range, a uniform blackening layer with suppressed plating unevenness can be formed. Accordingly, the conductive film of the invention is excellent in visibility. In the case where the mass ratio of nickel and zinc is less than the foregoing lower limit value, transparent components (for example, gelatin) peeled away from the silver salt photosensitive material increase; the transparent components deposit on the conductive film after the plating; and the appearance becomes poor. Also, when it exceeds the foregoing upper limit value, the black tint becomes insufficient, and the appearance becomes poor. Incidentally, in the case of its application to PDP, such poor appearance is considered to be a product deficiency and becomes a chief factor in lowering of production efficiency of a product. Also, it is preferable that the metallic silver part is formed in a fine line mesh-like state.

Also, it is preferable that at the blackening-layer-forming step, the foregoing blackening layer is formed in two or more stages by using a first blackening plating liquid containing nickel and zinc and a second blackening plating liquid containing nickel and zinc, and a content ratio of nickel in the first placing liquid is larger than a content ratio of nickel in the foregoing second plating liquid. At this time, the blackening layer is composed of two or more layers. With respect to the blackening layer composed of two or more layers, it is preferable that in the blackening layer of a surface layer, the zinc content is larger than the content of nickel. According to this manufacturing method, the deposition of transparent components is more suppressed, and the poor appearance can be more sufficiently suppressed.

In the case where the blackening layer is formed in two or more stages, from the viewpoint of suppressing the poor appearance, a content molar ratio of nickel and zinc of in the foregoing first plating liquid preferably satisfies the following formula (2), and more preferably satisfies the following formula (2-a); and this treatment is preferably carried out in a preceding stage of the second plating liquid.

$$Ni:Zn=10:1 \text{ to } 100:1 \quad (2)$$

$$Ni:Zn=20:1 \text{ to } 60:1 \quad (2\text{-a})$$

Also, a content molar ratio of nickel and zinc in the second plating liquid preferably satisfies the following formula (3), and more preferably satisfies the following formula (3-a).

$$Ni:Zn=1:1 \text{ to } 20:1 \quad (3)$$

$$Ni:Zn=2:1 \text{ to } 10:1 \quad (3\text{-a})$$

Advantages of the Invention

According to the invention, it is possible to provide an electromagnetic shielding film for plasma display which even when stored under a wet heat condition, is small in change of color taste with time and good in adhesion, with a blackening layer being hardly peeled away. Also, it is possible to provide a conductive film inexpensively with excellent conductive characteristics while keeping high productivity and an optically transparent electromagnetic shielding film having an excellent electromagnetic shielding effect.

In addition, by incorporating such a film into a flexible wiring board or a plasma display, it is possible to enhance conductivity and electromagnetic shielding performance.

DESCRIPTION OF REFERENCE NUMERALS AND SIGNS

Figure 1:
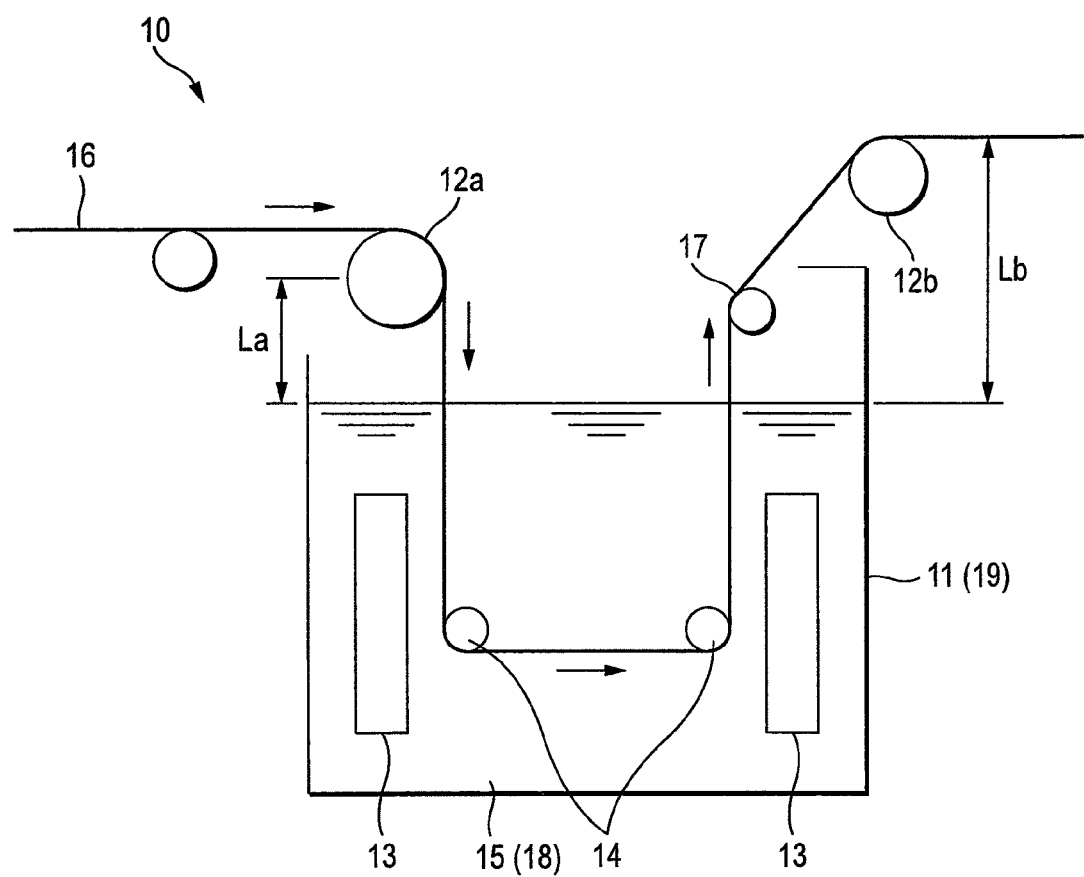
FIG. 1 is a schematic view to show an embodiment of the electroplating tank which is suitably used in the plating treatment method of the invention.

10: Electroplating tank
11 (19): Plating tank
12a, 12b: Feed roller
13: Anode plate
14: Guide roller
15 (18): Plating liquid
16: Film
17: Liquid draining roller

BEST MODE FOR CARRYING OUT THE INVENTION

In the conductive film of the invention (in the case where a forming region of a conductive metal layer is small and a transparent part is sufficiently large), a surface of the conductive metal layer in a pattern-like state having an electromagnetic shielding ability is covered by a blackening layer. The subject blackening layer contains a nickel/zinc alloy having an Ni/Zn mass ratio of from 0.5 to 50. According to an especially preferred embodiment of the invention, the conductive metal layer is configured to include a metallic silver part (for example, developed silver), for example, it is configured of silver in a fine line mesh-like state.

The use of such a nickel/zinc alloy having a specified Ni/Zn mass ratio not only enhances the stability of the blackening layer to improve elapsing properties over a long period of time or under a high temperature or high humidity condition but also effectively controls the light reflection on the film surface, thereby achieving the objects of the invention. In the case where the metal film capable of supporting the blackening layer on a surface thereof is a metal made of mesh-like silver as a substrate, especially a metal made of, as a substrate, developed silver obtained by developing a silver halide photosensitive material, blackness (low reflection properties) and adhesion (peeling resistance) of the blackening layer are improved, thereby further enhancing the performance as an electromagnetic shielding film. The "metal made of silver as a substrate" as referred to herein means silver per se or a metal or an alloy having a metal layer capable of being plated on a silver surface (for example, copper) provided on silver.

In the metal made of silver as substrate, any metal capable of being plated can be applied as the metal to be added to silver. Above all, copper, gold, chromium, and nickel are preferable, with copper being especially preferable. As a form in which such a metal is added to silver, it is preferable that the metal is formed on silver by plating; and while a plating layer may be formed on the entire surface of silver in a fine line state, a laminated constitution of a metallic silver layer and a plated metal layer wherein the metal is selectively deposited on a surface in a side opposite to a silver support may be taken. In particular, the latter is excellent in view of the matter that both conductivity and antireflection properties are made compatible with each other.

In the case where developed silver is used as the substrate, it is estimated that the foregoing excellent characteristics as the electromagnetic shielding film of the invention are based on the contribution to a protective action of gelatin which is a binder of a photosensitive layer of the used photosensitive material. In the photosensitive material, for the purpose of preventing fogging of a silver halide grain, benzotriazole, a benzotriazole derivative and a mercapto based compound are often contained in the photosensitive layer. In the invention, it has become clear that irrespective of the foregoing effects in the photosensitive material, when benzotriazole, a benzotriazole derivative and a mercapto based compound are contained in the shielding film, the stabilization with time of the film is improved.

The pattern-like metal film which is a subject of the conductive shielding film of the invention is not particularly limited so far as it is able to form the foregoing defined blackening layer on the surface thereof. For example, the pattern-like metal film is also applicable to films obtained by conductive sputtering on a support surface to some extent or provided with a vacuum vapor deposited thin film and metal layers obtained by forming a copper foil in a mesh-like state by etching. The pattern-like metal film is also applicable to metal patterns formed in a mesh-like state obtained by printing an electroless plating catalyst such as palladium on a transparent support by a method such as gravure printing and screen printing and then applying electroless plating and electroplating. The pattern-like metal film is also applicable to metal patterns formed in a mesh-like state obtained by printing a metallic silver grain dispersion on a transparent support and then applying electroplating by utilizing conductivity of a metallic silver pattern thereof. In addition, the pattern-like metal film is applicable to metal patterns formed in a mesh-like state obtained by applying electroplating to a conductive silver pattern formed by a silver salt diffusion transfer method.

However, as described previously, since a developed film obtained by applying operations as described later to the silver salt photosensitive material is especially preferable as a subject to which the invention is applied, materials and preparation method of a conductive shielding film are hereunder described with reference to a method of using a silver salt photosensitive material. However, it should not be construed that the invention is limited thereto.

It is also desirable that the film is a film having a mesh-like pattern of silver (silver mesh pattern); and it is preferable that the silver mesh pattern on the film is continuous (not electrically interrupted). It is better that even a part of the silver mesh pattern is connected. When the conductive pattern is interrupted, there is a possibility that a portion where the plating is not deposited is formed in the first electroplating tank or that the plating becomes uneven. By applying the plating treatment on this continuous silver mesh pattern, a conductive metal layer is formed on the silver mesh, and the plated film (conductive film) is useful as, for example, a printed wiring board formed on an insulator film or a PDP electromagnetic shielding film.

Incidentally, while the term "mesh" is in general a unit expressing a density of sieve opening, the "mesh" as referred to in this specification refers to a netlike sieve in a customary manner by those skilled in the art.

While the silver mesh pattern may be formed in any method, it is desirable that the silver mesh pattern is formed of developed silver. As the film having a silver mesh pattern formed of developed silver, a film formed by exposing and developing a photosensitive material having an emulsion layer containing a silver salt emulsion on a support is preferably used. A configuration of this photosensitive material and a manufacturing method of a film having a silver mesh pattern formed of developed silver by using this photosensitive material are hereunder described.

It is the most preferred embodiment that the invention is applied to a silver mesh pattern obtained by mesh-like pattern exposing and developing a photographic emulsion having a silver salt emulsion layer on a support as described previously. The silver mesh pattern becomes an irregularity-free and fast optically transparent electromagnetic shielding film by the plating treatment of the invention. Accordingly, a series of steps for obtaining an optically transparent electromagnetic shielding film from a silver salt emulsion other than the plating treatment are hereunder described.

1. Photosensitive Material [Emulsion Layer]:

It is preferable that the photosensitive material has an emulsion layer containing a silver salt emulsion as a photosensor on a support. The formation of the emulsion layer on the support can be achieved by using a known coating technology. The emulsion layer can contain a dye, a binder, a solvent, and so on in addition to the silver salt emulsion as the need arises. Respective components which constitute the emulsion layer are hereunder described.

(Dye)

A dye may be contained in the emulsion layer. The subject dye is contained as a filter dye or for the purpose of preventing irradiation or various other purposes. A solid disperse dye may be contained as the dye. Examples of the dye which is preferably used include dyes represented by the general formulae (FA), (FA1), (FA2) and (FA3) described in JP-A-9-179243, and concretely, Compounds F1 to F34 described in this patent document are preferable. (II-2) to (II-24) described in JP-A-7-152112, (III-5) to (III-18) described in JP-A-7-152112, (IV-2) to (IV-7) described in JP-A-7-152112, and so on are also preferably used.

Besides, as the dye which can be used, examples of a dye in a solid fine particle dispersion state which is decolored at the time of development or fixation treatment include cyanine dyes, pyrylium dyes and aminium dyes described in JP-A-3-138640. Also, examples of a dye which is not decolored at the time of treatment include cyanine dyes containing a carboxyl group described in JP-A-9-96891; cyanine dyes not containing an acid group described in JP-A-8-245902; lake type cyanine dyes described in JP-A-8-333519; cyanine dyes described in JP-A-1-266536; holopolar type cyanine dyes described in JP-A-3-136038; pyrylium dyes described in JP-A-62-299959; polymer type cyanine dyes described in JP-A-7-253639; solid fine particle dispersions of an oxonol dye described in JP-A-2-282244; light scattering particles described in JP-A-63-131135; Yb3+ compounds described in JP-A-9-5913; and ITO powders described in JP-A-7-113072. Dyes represented by the general formulae (F1) and (F2) described in JP-A-9-179243, and concretely, Compounds F35 to F112 described in this patent document can also be used.

A water-soluble dye can be contained as the dye. Examples of such a water-soluble dye include oxonol dyes, benzylidene dyes, merocyanine dyes, cyanine dyes, and azo dyes. Of these, oxonol dyes, hemioxonol dyes, and benzylidene dyes are useful. Specific examples of the water-soluble dye include those described in U.K. Patents Nos. 584,609 and 1,177,429, JP-A-48-85130, JP-A-49-99620, JP-A-49-114420, JP-A-52-20822, JP-A-59-154439 and JP-A-59-208548, and U.S. Pat. Nos. 2,274,782, 2,533,472, 2,956,879, 3,148,187, 3,177,078, 3,247,127, 3,540,887, 3,575,704, 3,653,905 and 3,718,427.

From the viewpoints of an effect for preventing irradiation or the like and a lowering in sensitivity due to an increase of the addition amount, the content of the dye in the emulsion layer is preferably from 0.01 to 10% by weight, and more preferably from 0.1 to 5% by weight based on the whole solids.

(Silver Salt Emulsion)

Examples of the silver salt emulsion include inorganic silver salts such as silver halides and organic silver salts such as silver acetate. It is preferred to use a silver halide emulsion having excellent characteristics as a photosensor. Technologies which are employed in silver salt photographic films or printing papers, printing plate making films, photomask films, and so on regarding a silver halide can also be employed in the photosensitive material according to the present embodiment.

The halogen element to be contained in the silver halide may be any of chlorine, bromine, iodine, or fluorine or may be a combination thereof. A silver halide containing, for example, AgCl, AgBr, or AgI as a major component is preferably used; and a silver halide containing AgBr or Ag Cl as a major component is more preferably used. Silver chlorobromide, silver iodochlorobromide and silver iodobromide are also preferably used. Silver chloropromide, silver bromide, silver iodochlorobromide, and silver iodo-bromide are more preferable; and silver chlorobromide and silver iodochlorobromide each containing 50% by mole or more of silver chloride are most preferably used.

Incidentally, the "silver halide containing AgBr (silver bromide) as a major component" as referred to herein refers to a silver halide having a molar fraction of a bromide ion in the silver halide composition of 50% or more. This silver halide grain containing AgBr as a major component may contain an iodide ion and a chloride ion in addition to the bromide ion.

The silver halide is in a solid grain state; and from the viewpoint of the shape of the silver mesh pattern formed after the exposure and development, an average grain size of the silver halide is preferably from 0.1 to 1,000 nm (1 µm), more preferably from 0.1 to 100 nm, and further preferably from 1 to 50 nm in terms of a sphere-corresponding diameter.

The "sphere-corresponding diameter of silver halide grain" as referred to herein means a diameter of a grain having a spherical grain shape and having the same volume.

The shape of the silver halide grain is not particularly limited, and examples thereof include various shapes such as a spherical shape, a cubic shape, a tabular shape (for example, a hexagonal tabular shape, a triangular tabular shape, and a square tabular shape), an octahedral shape, and a tetradecahedral shape. Of these, a cubic shape and a tetradecahedral shape are preferable.

With respect to the silver halide grain, the inside and the surface layer may be made of the same phase or may be made of a different phase from each other. Also, a localized layer having a different halogen composition may be present in the inside or surface of the grain.

The silver halide emulsion which is a coating solution for emulsion layer can be prepared by methods described in P. Glafkides, *Chimie et Physique Photogtraphique* (published by Paul Montel, 1967), G. F. Duffin, *Photographic Emulsion Chemistry* (published by The Focal Press, 1966), and V. L. Zelikman, et al., *Making and Coating Photographic Emulsion* (published by The Focal Press, 1964).

That is, as a preparation method of the silver halide emulsion, any of an acidic method or a neutral method may be employed; and as a method of reacting a soluble silver salt and a soluble halogen salt, any of a single jet mixing method, a double jet mixing method, or a combination thereof may be employed.

As a method of forming a silver grain, a method of forming a grain in the presence of an excess of a silver ion (so-called reverse mixing method) can also be employed. In addition, a method of keeping a pAg in a liquid phase where the silver halide is formed constant, namely a so-called controlled double jet mixing method can be employed as one mode of the double jet mixing method.

It is also preferred to form a grain by using a so-called silver halide solvent such as ammonia, a thioether, and a tetra-substituted thiourea. As such a method, a method of using a tetra-substituted thiourea compound is more preferable and is described in, for example, JP-A-53-82408 and JP-A-55-77737.

Preferred examples of the thiourea compound include tetramethylthiourea and 1,3-dimethyl-2-imidazolidinethione. Though the addition amount of the silver halide solvent varies with the kind of a compound to be used, the desired grain size and the halogen composition, it is preferably from $10^{-5}$ to $10^{-2}$ moles per mole of the silver halide.

The controlled double jet method and the method of forming a grain by using a silver halide solvent are easy for preparing a silver halide emulsion having a regular crystal type and having a narrow grain size distribution and can be preferably employed.

For the purpose of making the grain size uniform, it is preferred to rapidly grow silver within a range not exceeding a critical degree of saturation by using a method of altering the addition rate of silver nitrate or a halogenated alkali corresponding to the grain growth rate as described in U.K. Patent No. 1,535,016, JP-B-48-36890 and JP-B-52-16364, or a method of altering the concentration of an aqueous solution as described in U.S. Pat. No. 4,242,445 and JP-A-55-158124.

The silver halide emulsion which is used for the formation of an emulsion layer is preferably a monodispersed emulsion, and its coefficient of fluctuation expressed by {[(standard deviation of grain size)/(average grain size)]×100} is preferably not more than 20%, more preferably not more than 15%, and most preferably not more than 10%.

The silver halide emulsion may be a mixture of plural kinds of silver halide emulsions having a different grain size from each other.

The silver halide emulsion may contain a metal belonging to the group VIII or the group VIIB. In particular, for the purpose of achieving high contrast and low fog, it is preferable that the silver halide emulsion contains a rhodium compound, an iridium compound, a ruthenium compound, an iron compound, an osmium compound, or the like. Such a compound may be a compound containing a ligand of every kind. Examples of the ligand include an cyanide ion, a halogen ion, a thiocyanate ion, a nitrosyl ion, water, a hydroxide ion, pseudo-halogens thereof, and ammonia; and besides, organic molecules such as amines (for example, methylamine and ethylenediamine), heterocyclic compounds (for example, imidazole, thiazole, 5-methylthiazole, and mercaptoimidazole), ureas, and thioureas.

For the purpose of achieving high sensitivity, doping with a metal hexacyano complex such as $K_4[Fe(CN)_6]$, $K_4[Re(CN)_6]$, and $K_3[Cr(CN)_6]$ is advantageously carried out.

As the rhodium compound, a water-soluble rhodium compound can be used. Examples of the water-soluble rhodium compound include rhodium(III) halide compounds, hexachlororhodate(III) complex salts, pentachloroaquorhodate complex salts, tetrachlorodiaquorhodate complex salts, hexabromorhodate(III) complex salts, hexamminerhodate(III) complex salts, trioxalatorhodate(III) complex salts, and $K_3Rh_2Br_9$.

While such a rhodium compound is used upon being dissolved in water or an appropriate solvent, a method which is often employed for the purpose of stabilizing a solution of a rhodium compound, namely a method of adding a hydrogen halide aqueous solution (for example, hydrochloric acid, hydrobromic acid, and hydrofluoric acid) or a halogenated alkali (for example, KCl, NaCl, KBr, and NaBr) can be employed. Instead of using the water-soluble rhodium compound, it is also possible to add another silver halide grain which has been doped with rhodium in advance and to dissolve it at the time of preparation of a silver halide.

Examples of the iridium compound include hexachloroiridate complex salts (for example, $K_2IrCl_6$ and $K_3IrCl_6$), hexabromoiridate complex salts, a hexaammineiridate complex salts, and pentachloronitrosyliridate complex salts.

Examples of the ruthenium compound include hexachlororuthenium, pentachloronitrosylruthenium, and $K_4[Ru(CN)_6]$.

Examples of the iron compound include potassium hexacyanoferrate(II) and ferric thiocyanate.

The ruthenium or osmium compound is added in a form of a water-soluble complex salt described in, for example, JP-A-63-2042, JP-A-1-285941, JP-A-2-20852, and JP-A-2-20855. Of these, a hexacoordinated complex represented by the following formula is especially preferable.

$$[ML_6]^{-n}$$

In the foregoing formula, M represents Ru or Os; and n represents 0, 1, 2, 3 or 4.

In that case, a counter ion is not important, and for example, an ammonium or alkali metal ion is useful. Preferred examples of the ligand include a halide ligand, a cyanide ligand, a cyanate ligand, a nitrosyl ligand, and a thionitrosyl ligand. Specific examples of the complex which is used in the invention are given below, but it should not be construed that the invention is limited thereto.

[RuCl$_6$]$^{-3}$, [RuCl$_4$(H$_2$O)$_2$]$^{-1}$, [RuCl$_5$(NO)]$^{-2}$, [RuBr$_5$(NS)]$^{-2}$, [Ru(CO)$_3$Cl$_3$]$^{-2}$, [Ru(CO)Cl$_5$]$^{-2}$, [Ru(CO)Br$_5$]$^{-2}$, [OsCl$_6$]$^{-3}$, [OsCl$_5$(NO)]$^{-2}$, [Os(NO)(CN)$_5$]$^{-2}$, [Os(NS)Br$_5$]$^{-2}$, [Os(CN)$_6$]$^{-4}$, and [Os(O)$_2$(CN)$_5$]$^{-4}$.

The addition amount of such a compound is preferably from $10^{-10}$ to $10^{-2}$ moles/mole of Ag, and more preferably from $10^{-9}$ to $10^{-3}$ moles/mole of Ag based on one mole of the silver halide.

Besides, a silver halide containing a Pb(II) ion and/or a Pd metal can also be preferably used. Though Pd may be uniformly distributed in the silver halide grain, it is preferable that Pd is contained in the vicinity of the surface layer of the silver halide grain. It is meant by the terms "Pd is contained in the vicinity of the surface layer of the silver halide grain" as referred to herein that a layer having a higher content of palladium than other layers is made present within 50 nm in a depth direction from the surface of the silver halide grain.

Such a silver halide grain can be prepared by adding Pd on the way of the formation of a silver halide grain. It is preferred to add Pd after adding a silver ion and a halogen ion in an amount of 50% or more of the total addition amount, respectively. It is also preferable that Pd is made present in the surface layer of the silver halide by a method of adding a Pd(II) ion at the time of post ripening or other method.

The content of the Pd ion and/or the Pd metal contained in the silver halide is preferably from $10^{-4}$ to 0.5 moles/mole of Ag, and more preferably from 0.01 to 0.3 moles/mole of Ag based on the molar number of silver of the silver halide.

Examples of the Pd compound which is used include PdCl$_4$ and Na$_2$PdCl$_4$.

In addition, for the purpose of enhancing the sensitivity as a photosensor, chemical sensitization which is carried out in a photographic emulsion can be applied. Examples of the chemical sensitization method include chalcogen sensitization (for example, sulfur sensitization, selenium sensitization, and tellurium sensitization), noble metal sensitization (for example, gold sensitization), and reduction sensitization. Such sensitization is employed singly or in combination thereof. In the case of using a combination of the chemical sensitization methods, for example, a combination of sulfur sensitization and gold sensitization, a combination of sulfur sensitization, selenium sensitization and gold sensitization, and a combination of sulfur sensitization, tellurium sensitization and gold sensitization are preferable.

The sulfur sensitization is in general carried out by adding a sulfur sensitizer and stirring an emulsion at a high temperature of 40° C. or higher for a fixed time. Known compounds can be used as the sulfur sensitizer. For example, in addition to a sulfur compound which is contained in gelatin, various sulfur compounds such as thiosulfates, thioureas, thiazoles, and rhodanines can be used. Of these, thiosulfates and thiourea compounds are preferable as the sulfur compound. The addition amount of the sulfur sensitizer varies under various conditions such as pH and temperature at the time of chemical ripening and a size of the silver halide grain and is preferably from $10^{-7}$ to $10^{-2}$ moles, and more preferably from $10^{-5}$ to $10^{-3}$ moles per mole of the silver halide.

As a selenium sensitizer which is used in the selenium sensitization, known selenium compounds can be used. That is, the selenium sensitization is in general carried out by adding an unstable type and/or non-unstable type selenium compound and stirring an emulsion at a high temperature of 40° C. or higher for a fixed time. As the unstable type selenium compound, compounds described in, for example, JP-B-44-15748, JP-B-43-13489, JP-A-4-109240, and JP-A-4-324855 can be used. In particular, compounds represented by the general formulae (VIII) and (IX) described in JP-A-4-324855 are preferably used.

A tellurium sensitizer which is used in the tellurium sensitization is a compound capable of forming silver telluride which is estimated to become a sensitization nucleus on the surface or in the inside of the silver halide grain. A formation rate of silver telluride in the silver halide emulsion can be tested by a method described in JP-A-5-313284. Concretely, compounds described in U.S. Pat. Nos. 1,623,499, 3,320,069 and 3,772,031, U.K. Patents 235,211, 1,121,496, 1,295,462 and 1,396,696, Canadian Patent No. 800,958, JP-A-4-204640, JP-A-4-271341, JP-A-4-333043, JP-A-5-303157, *J. Chem. Soc. Chem. Commun.*, page 635 (1980), *ibid.*, page 1102 (1979), *ibid.*, page 645 (1979), *J. Chem. Soc. Perkin. Trans.*, Vol. 1, page 2191 (1980), S. Patai ed., *The Chemistry of Organic Selenium and Tellurium Compounds*, Vol. 1 (1986), and *ibid.*, Vol. 2 (1987) can be used. Compounds represented by the general formulae (II), (III) and (IV) described in JP-A-5-313284 are especially preferable.

The use amount of each of the selenium sensitizer and the tellurium sensitizer varies with the silver halide grain to be used, the chemical ripening condition, and so on and is in general from approximately $10^{-8}$ to $10^{-2}$ moles, and preferably from approximately $10^{-7}$ to $10^{-3}$ moles per mole of the silver halide. In the invention, while the condition of the chemical sensitization is not particularly limited, the pH is from 5 to 8; the pAg is from 6 to 11, and preferably from 7 to 10; and the temperature is from 40 to 95° C., and preferably from 45 to 85° C.

Examples of the noble metal sensitizer include gold, platinum, palladium, and iridium sensitizers. Above all, gold sensitization is especially preferable. Specific examples of the gold sensitizer which is used in the gold sensitization include chloroauric acid, potassium chloroaurate, potassium aurithiocyanate, gold sulfide, gold(I) thioglucose, and gold(I) thiomannose. The gold sensitizer can be used in an amount of from approximately $10^{-7}$ to $10^{-2}$ moles per mole of the silver halide. In the silver halide emulsion which is used in the invention, a cadmium salt, a sulfurous acid salt, a lead salt, a thallium salt, or the like may be copresent during the course of formation or physical ripening of a silver halide grain.

Reduction sensitization can be applied to the silver salt emulsion. As a reduction sensitizer, stannous salts, amines, formamidinesulfinic acid, silane compounds, and so on can be used. In the silver halide emulsion, a thiosulfonic acid compound may be added by a method described in EP-A-293917. The silver halide emulsion which is used for the preparation of the photosensitive material used in the invention may be a single emulsion or a combination of two or more emulsions (for example, a combination of emulsions having a different average grain size from each other, a combination of emulsions having a different halogen composition from each other, a combination of emulsions having a different crystal habit from each other, a combination of emulsions having a different condition of chemical sensitization from each other, and a combination of emulsions having a different sensitivity from each other). Above all, in order to obtain high contrast, it is preferred to coat an emulsion with high sensitivity in a part closer to the support as described in JP-A-6-324426.

(Binder)

For the purposes of uniformly dispersing the silver salt grain and assisting the adhesion between the emulsion layer and the support, a binder can be used. While all of water-insoluble polymers and water-soluble polymers can be used as the binder, water-soluble polymers are preferably used.

Examples of the binder include gelatin, polyvinyl alcohol (PVA), polyvinylpyrrolidone (PVP), polysaccharides such as starch, cellulose and derivatives thereof, polyethylene oxide, polysaccharides, polyvinylamine, chitosan, polylysin, polyacrylic acid, polyalginic acid, polyhyaluronic acid, and carboxycellulose. Such a binder has neutral, anionic or cationic properties depending upon the ionicity of a functional group.

The content of the binder to be contained in the emulsion layer is not particularly limited and can be properly determined within a range where the binder can exhibit dispersibility and adhesion.

(Solvent)

A solvent which is used for the formation of an emulsion layer is not particularly limited, and examples thereof include water, organic solvents (for example, alcohols such as methanol, ketones such as acetone, amides such as formamide, sulfoxides such as dimethyl sulfoxide, esters such as ethyl acetate, and ethers), ionic liquids, and mixed solvents thereof.

The content of the solvent to be used in the emulsion layer is preferably in the range of from 30 to 90% by weight, and more preferably in the range of from 50 to 80% by weight based on the weight of the total sum of the silver salt, the binder, and so on which are contained in the emulsion layer.

[Support]

As the support which is used in the photosensitive material, a plastic film, a plastic plate, a glass plate, and so on can be used.

Examples of raw materials which can be used for the plastic film and plastic plate include polyesters such as polyethylene terephthalate (PET) and polyethylene naphthalate; polyolefins such as polyethylene (PE), polypropylene (PP), polystyrene, and EVA; vinyl based resins such as polyvinyl chloride and polyvinylidene chloride; and besides, polyether ether ketone (PEEK), polysulfone (PSF), polyether sulfone (PES), polycarbonates (PC), polyamides, polyimides, acrylic resins, and triacetyl cellulose (TAC).

In the invention, from the standpoints of transparency, heat resistance, easiness of handling and costs, the plastic film is preferably a polyethylene terephthalate film.

In the case where a plated conductive film is used as an electromagnetic shielding film for display, since the subject electromagnetic shielding film is required to have transparency, it is desirable that the support has high transparency. In that case, a total visible light transmittance of the plastic film or plastic plate is preferably from 70 to 100%, more preferably from 85 to 100%, and especially preferably from 90 to 100%. As the plastic film or plastic plate or the like, one colored to an extent that there is no problem as an application of a conductive film can also be used.

Though the plastic film or plastic plate can be used as a single layer, a multilayered film made of a combination of two or more layers can also be used.

A thickness of the plastic film or plastic plate is preferably not more than 200 μm, more preferably from 20 μm to 180 μm, and most preferably from 50 μm to 120 μm.

In the case of using a glass plate as the support, its kind is not particularly limited. When the conductive film is used as an application of an electromagnetic shielding film for display, it is preferred to use a tempered glass provided with a reinforced layer on a surface thereof. The tempered glass has a high possibility that breakage can be prevented as compared with a non-tempered glass. In addition, a tempered glass obtained by a windchill method is preferable in safety because even if it is broken by any chance, its crushed fragments are small and end faces thereof are not sharp.

[Protective Layer]

In the photosensitive material, a protective layer made of a binder such as gelatin and a high molecular weight polymer may be provided on the emulsion layer. By providing the protective layer, a scratch can be prevented, or dynamic characteristics can be improved. However, in view of the plating treatment, it is preferable that the protective layer is not provided. When the protective layer is provided, it is preferable that its thickness is thin (for example, not more than 0.2 μm). A formation method regarding a coating method of the protective layer is not particularly limited, and a known coating method can be properly chosen.

2. Manufacture of Conductive Film (for Example, Transparent Electromagnetic Shielding Film):

The method of manufacturing a conductive film of the invention includes a step of exposing and developing the foregoing photosensitive material to form a metallic silver part, a plating step of plating the foregoing metallic silver part to form a plating layer (conductive metal layer forming step), and a blackening layer forming step of forming a blackening layer having a mass ratio of nickel and zinc satisfied with the following formula (1) on the foregoing plating layer by using a plating liquid containing nickel and zinc. Incidentally, it is preferable that the metallic silver part is formed in a mesh pattern-like state.

$$Ni:Zn=0.5:1 \text{ to } 50:1 \tag{1}$$

[Exposure]

The exposure can be carried out by using an electromagnetic wave. Examples of the electromagnetic wave include lights such as visible light rays and ultraviolet rays and radiations such as X-rays. In addition, a light source having a wavelength distribution may be utilized or a light source having a specified wavelength may be used for the exposure.

Examples of the light source include scanning exposure using a cathode ray tube (CRT) exposure unit. The cathode ray tube exposure unit is simple and easy, compact in size and low in costs as compared with a unit using a laser. Also, the cathode ray tube exposure unit is easy for the adjustment of optical axis and color. For the cathode ray tube to be used in image exposure, a luminant of every kind exhibiting light emission in a spectral region is used as the need arises. For example, any one of a red luminant, a green luminant and a blue luminant or a mixture of two or more kinds thereof is used. The spectral region is not limited to the red, green or blue spectral region, and a phosphor capable of emitting light in a yellow, orange, violet or infrared region is also useful. In particular, a cathode ray tube capable of emitting light white upon mixing these luminants is often used. An ultraviolet ray lamp is also preferable; and a g-line of mercury vapor lamp, an i-line of mercury vapor lamp, and so on are utilized, too.

The exposure can be carried out by using various laser beams. For example, a scanning exposure system using, as a laser, monochromatic high-density light (for example, a gas laser, a light emitting diode, a semiconductor laser, and a second harmonic generation (SHG) light source which is a combination of a semiconductor laser or a solid laser using a semiconductor laser as an excitation light source and a non-linear optical crystal) can be preferably employed. In addition, a KrF excimer laser, an ArF excimer laser, an F2 laser, and so on can be used. In order to make the system compact and inexpensive, it is preferable that the exposure is carried out by using a semiconductor laser or a second harmonic generation (SHG) light source which is a combination of a semiconductor laser or a solid laser and a non-linear optical crystal. In order to design a unit which is compact in size, inexpensive in costs, long in life and high in safety, it is especially preferable that the exposure is carried out by using a semiconductor laser.

Concretely, a blue semiconductor laser having a wavelength of from 430 to 460 nm (announced by Nichia Corporation in The 48th Annual Meeting of JSAP held in March 2001), a green laser of about 530 nm obtained by wavelength converting a semiconductor laser (oscillation wavelength: about 1,060 nm) by an SHG crystal of $LiNbO_3$ having an inverted domain structure in a waveguide state and extracting it, a red semiconductor laser having a wavelength of about 685 nm (Hitachi Type No. HL6738MG), a red semiconductor laser having a wavelength of about 650 nm (Hitachi Type No. HL6501MG), and so on can be preferably employed.

It is preferable that the exposure is achieved in a pattern-like form such as a lattice-like form. As a method of pattern exposure, the pattern exposure may be achieved by surface exposure utilizing a photomask or may be achieved by scanning exposure by laser beams. On that occasion, exposure systems such as refraction type exposure using a lens, reflection type exposure using a reflecting mirror, contact exposure, proximity exposure, reduction projection exposure, and reflection projection exposure can be employed.

[Development Treatment]

As the development treatment, usual development treatment technologies which are employed in silver salt photographic films or printing papers, printing plate making films, emulsion masks for photomask, and so on can be employed. While a developing solution is not particularly limited, for example, PQ developing solutions, MQ developing solutions, and MAA developing solutions can be used. Examples of commercially available developing solutions include CN-16, CR-56, CP45X, FD-3, and PAPITOL, all of which are produced by FUJIFILM Corporation; C-41, E-6, RA-4, D-19, and D-72, all of which are produced by KODAK Limited; and developing solutions contained in kits thereof.

Lith developing solutions can also be used, and D85 which is produced by KODAK Limited can be used as the lith developing solution.

A dihydroxybenzene based developing agent can be used as the developing solution. Examples of the dihydroxybenzene based developing agent include hydroquinone, chlorohydroquinone, isopropyl hydroquinone, methyl hydroquinone, and a hydroquinone monosulfonate. Of these, hydroquinone is especially preferable. Examples of an auxiliary developing agent exhibiting superadditivity along with the dihydroxybenzene based developing agent include 1-phenyl-3-pyrazolidones and p-aminophenols. As the developing solution which is used in the manufacturing method of the invention, a combination of a dihydroxybenzene based developing agent and a 1-phenyl-3-pyrazolidone or a combination of a dihydroxybenzene based developing agent and a p-aminophenol is preferably used.

Specific examples of the developing agent to be combined with the 1-phenyl-3-pyrazolidone or its derivative used as the auxiliary developing agent include 1-phenyl-3-pyrazolidone, 1-phenyl-4,4-dimethyl-3-pyrazolidone, and 1-phenyl-4-methyl-4-hydroxymethyl-3-pyrazolidone.

Examples of the p-aminophenol based auxiliary developing agent include N-methyl-p-aminophenol, p-aminophenol, N-(β-hydroxyethyl)-p-aminophenol, and N-(4-hydroxyphenyl)glycine. Of these, N-methyl-p-aminophenol is preferable. In general, the dihydroxybenzene based developing agent is preferably used in an amount in the range of from 0.05 to 0.8 moles/L, more preferably 0.23 moles/L or more, and further preferably from 0.23 to 0.6 moles/L. In the case of using a combination of the dihydroxybenzene with the 1-phenyl-3-pyrazolidone or p-aminophenol, the former is preferably used in an amount of from 0.23 to 0.6 moles/L, and more preferably from 0.23 to 0.5 moles/L, whereas the latter is preferably used in an amount of not more than 0.06 moles/L, and more preferably from 0.03 to 0.003 moles/L.

In the developing solution (both a development initiation liquid and a development replenisher will be hereinafter sometimes summarized and referred to simply as "developing solution"), usually used additives (for example, a preservative and a chelating agent) can be contained. Examples of the preservative include sulfites such as sodium sulfite, potassium sulfite, lithium sulfite, ammonium sulfite, sodium bisulfite, potassium metabisulfite, and sodium formaldehyde bisulfite. The subject sulfite is preferably used in an amount of 0.20 moles/L or more, and more preferably 0.3 moles/L or more. However, since use of the sulfite in an excessively large amount causes silver staining in the developing agent, its upper limit is desirably 1.2 moles/L. The amount of the sulfite is especially preferably from 0.35 to 0.7 moles/L.

A small amount of an ascorbic acid derivative may be used together with the sulfite as the preservative of the dihydroxybenzene based developing agent. The "ascorbic acid derivative" as referred to herein includes ascorbic acid and erythorbic acid as a stereo isomer thereof and alkali metal salts thereof (for example, sodium and potassium salts). In view of the raw material costs, it is preferred to use sodium erythorbate as the ascorbic acid derivative. The addition amount of the ascorbic acid derivative is preferably in the range of from 0.03 to 0.12, and especially preferably in the range of from 0.05 to 0.10 in terms of a molar ratio based on the dihydroxybenzene based developing agent. In the case of using the ascorbic acid derivative as the preservative, it is preferable that a boron compound is not contained in the developing solution.

As other additives than those described above which can be used in the developing solution, development inhibitors such as sodium bromide and potassium bromide; organic solvents such as ethylene glycol, diethylene glycol, triethylene glycol, and dimethylformamide; development accelerators such as alkanolamines (for example, diethanolamine and triethanolamine), imidazole and derivatives thereof; and antifogging agents or black pepper preventing agents such as mercapto based compounds, indazole based compounds, benzotriazole based compounds, and benzimidazole based compounds may be contained. Specific examples of the benzimidazole based compound include 5-nitroindazole, 5-p-nitrobenzoyl-aminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenzotriazole, sodium 4-[(2-mercapto-1,3,4-thiazol-2-yl)thio]butanesulfonate, 5-amino-1,3,4-thiadiazol-2-thiol, methylbenzotriazole, 5-methylbenzotriazole, and 2-mercaptobenzotriazole. In general, the content of the benzimidazole based compound is preferably from 0.01 to 10 mmoles, and more preferably from 0.1 to 2 mmoles per liter of the developing solution.

In addition, various organic or inorganic chelating agents can be used jointly in the developing solution. Sodium tetrapolyphosphate, sodium hexametaphosphate, and so on can be used as the inorganic chelating agent. On the other hand, organic carboxylic acids, aminopolycarboxylic acids, organic phosphonic acids, aminophosphonic acids, and organic phosphonocarboxylic acids can be mainly used as the organic chelating agent.

The addition amount of such a chelating agent is preferably from $1 \times 10^{-4}$ to $1 \times 10^{-1}$ moles, and more preferably from $1 \times 10^{-3}$ to $1 \times 10^{-2}$ moles per liter of the developing solution.

In addition, compounds described in JP-A-56-24347, JP-B-56-46585, JP-B-62-2894, and JP-A-4-362942 can be used as a silver stain preventing agent in the developing solution.

Also, compounds described in JP-A-61-267759 can be used as a dissolution aid. In addition, the developing solution may contain a color toning agent, a surfactant, an antifoaming agent, a film-hardener, and so on as the need arises.

The development treatment temperature and time are mutually related and are determined in relation with the total treatment time. In general, the development temperature is preferably from about 20° C. to about 50° C., and more preferably from 25° C. to 45° C.; and the development time is preferably from 5 seconds to 2 minutes, and more preferably from 7 seconds to 1 minute 30 seconds.

The development treatment can include fixation treatment which is carried out for the purposes of removing a silver salt in an unexposed area and stabilizing it. Technologies of fixation treatment which are employed in silver salt photographic films or printing papers, printing plate making films, emulsion masks for photomask, and so on can be employed as the fixation treatment.

The following can be enumerated as preferred components of a fixing solution which is used in the fixation treatment step.

That is, it is preferable that the fixing solution contains sodium thiosulfate and ammonium thisulfate and optionally, tartaric acid, citric acid, gluconic acid, boric acid, iminodiacetic acid, 5-sulfonsalicylic acid, glucoheptanoic acid, tiron, ethylenediaminetetraacetic acid, diethylenetriaminepentaacetic acid, nitrilotriacetic acid, and salts thereof. From the viewpoint of environmental protection of recent years, it is preferable that the fixing solution does not contain boric acid. Examples of a fixing agent which is used in the fixing solution include sodium thiosulfate and ammonium thiosulfate. From the standpoint of fixing rate, ammonium thiosulfate is preferable, and from the viewpoint of environmental protection of recent years, sodium thiosulfate may be used. The use amount of such an already known fixing agent can be properly varied and is in general from about 0.1 to about 2 moles/L, and especially preferably from 0.2 to 1.5 moles/L. If desired, the fixing solution can contain a film-hardener (for example, water-soluble aluminum compounds), a preservative (for example, sulfites and bi-sulfites), a pH buffer (for example, acetic acid), a pH modifier (for example, ammonia and sulfuric acid), a chelating agent, a surfactant, a wetting agent, and a fixing accelerator.

Examples of the surfactant include anionic surfactants such as sulfated substances and sulfonated substances, polyethylene based surfactants, and ampholytic surfactants described in JP-A-57-6740. A known antifoaming agent may also be added in the fixing solution.

Examples of the wetting agent include alkanolamines and alkylene glycols. Examples of the fixing accelerator include thiourea derivatives described in JP-B-45-35754, JP-B-58-122535, and JP-B-58-122536; alcohols containing a triple bond in a molecule thereof; thioether compounds described in U.S. Pat. No. 4,126,459; and mesoion compounds described in JP-A-4-229860. Compounds described in JP-A-2-44355 may also be used. Examples of the pH buffer which can be used include organic acids such as acetic acid, malic acid, succinic acid, tartaric acid, citric acid, oxalic acid, maleic acid, glycolic acid, and adipic acid; and inorganic buffers such as boric acid, phosphates, and sulfites. Of these, acetic acid, tartaric acid, and sulfites are preferably used as the pH buffer. Here, the pH buffer is used for the purpose of preventing an increase of the pH of the fixing agent due to carrying in of the developing solution and is preferably used in an amount of from approximately 0.01 to 1.0 mole/L, and more preferably from approximately 0.02 to 0.6 moles/L. A pH of the fixing solution is preferably in the range of from 4.0 to 6.5, and especially preferably from 4.5 to 6.0. Compounds described in JP-A-64-4739 can also be used as a dye elution accelerator.

Examples of the film-hardener in the fixing solution include water-soluble aluminum salts and chromium salts. Of these, water-soluble aluminum salts are preferable as the film-hardener, and examples thereof include aluminum chloride, aluminum sulfate, and potassium alum. The addition amount of the film-hardener is preferably from 0.01 to 0.2 moles/L, and more preferably from 0.03 to 0.08 moles/L.

The fixation temperature in the fixation step is preferably from about 20° C. to about 50° C., and more preferably from 25 to 45° C. The fixation time is preferably from 5 seconds to 1 minute, and more preferably from 7 seconds to 50 seconds. The replenishment amount of the fixing solution is preferably not more than 600 mL/m$^2$, more preferably not more than 500 mL/m$^2$, and especially preferably not more than 300 mL/m$^2$ based on the treatment amount of the photosensitive material.

It is preferable that water washing treatment or stabilization treatment is applied to the developed and fixed photosensitive material. The water washing is in general carried out in an amount of not more than 20 liters per 1 m$^2$ of the photosensitive material and can also be carried out in a replenishment amount of not more than 3 liters (inclusive of 0, namely washing with stored water). For that reason, not only it is possible to achieve water-saving treatment, but also it is possible to make piping of processor establishment unnecessary. As a method of minimizing the replenishment amount of washing water, a multistage counter-current system (for example, a two-stage or three-stage counter-current system) has been known for long. In the case of applying this multistage counter-current system to the manufacturing method of the invention, the fixed photosensitive material is treated while successively coming into a normal direction, namely a direction of a treatment liquid not stained with the fixing solution step by step, and therefore, water washing with better efficiency is achieved. In the case of achieving the water washing with a small amount of water, it is more preferable that a rinsing tank of squeeze rollers or crossover rollers described in, for example, JP-A-63-18350 and JP-A-62-287252 is provided. For the purpose of reducing a load against the environmental pollution which is of a problem at the time of washing with a small amount of water, addition of an additive of every kind or filtration by a filter may be combined. In addition, in the foregoing method, a part or the whole of an overflow liquid from a water washing bath or a stabilizing bath generated by optionally replenishing water to which a mold preventing measure has been applied in the water washing bath or stabilizing bath can be utilized for a treatment liquid having a fixation ability in the preceding treatment step as described in JP-A-60-235133. For the purpose of preventing unevenness of bubbles which is easily generated at the time of washing with a small amount of water and/or preventing transfer of treating agent components attached in squeeze rollers onto the treated film, a water-soluble surfactant or an antifoaming agent may be added.

In the water washing treatment or stabilization treatment, a dye adsorbing agent described in JP-A-63-163456 may be established in a water washing tank for the purpose of preventing the contamination with a dye eluted from the photosensitive material. In the stabilization treatment to be performed subsequent to the water washing treatment, a bath containing a compound described in JP-A-2-201357, JP-A-

2-132435, JP-A-1-102553 or JP-A-46-44446 may be used as a final bath of the photosensitive material. On that occasion, an ammonium compound, a metal compound such as Bi and Al, a fluorescent brightener, a chelating agent of every kind, a film pH modifier, a film-hardener, a bactericide, a mold preventive, an alkanolamine, or surfactant can be added as the need arises. As the water which is used in the water washing step or stabilization step, in addition to tap water, deionized water or water sterilized by a halogen, an ultraviolet ray germicidal lamp, an oxidizing agent of every kind (for example, ozone, hydrogen peroxide, and chlorates), or the like is preferably used. Washing water containing a compound described in JP-A-4-39652 or JP-A-5-241309 may also be used.

In the water washing treatment or stabilization treatment, the bath temperature and the time are preferably from 0 to 50° C. and from 5 seconds to 2 minutes, respectively.

With respect to the weight of metallic silver in an exposed area after the development treatment, the content is preferably 50% by weight or more, and more preferably 80% by weight or more based on the weight of silver contained in the exposed area before the exposure. When the weight of silver contained in the exposed area is 50% by weight or more based on the weight of silver contained in the exposed area before the exposure, high conductivity can be obtained.

Though a gradation after the development treatment is not particularly limited, it preferably exceeds 4.0. When the gradation after the development treatment exceeds 4.0, it is possible to enhance the conductivity while keeping the transparency of a light transmitting part high. Examples of a measure for making the gradation exceed 4.0 include doping with a rhodium ion or an iridium ion as described previously.

Incidentally, physical development treatment may be applied to the metallic silver part after the development treatment. The "physical development" as referred to herein means deposition of a metal grain on a nucleus of a metal or a metal compound upon reduction of a metal ion such as a silver ion with a reducing agent. This physical development is utilized in manufacture of instant black and white films, instant slide films, printing plates, and so on. Technologies used therein can be applied in the present embodiment.

The physical development may be carried out simultaneously with the development treatment or may be separately carried out after the development treatment.

[Oxidation Treatment]

Oxidation treatment may be applied to a developed silver part after the development treatment. By performing the oxidation treatment, for example, in the case where a metal is slightly deposited in a light transmitting part other than the developed silver part, it is possible to control the transmittance of the light transmitting part at substantially 100% upon removal of the subject metal.

Examples of the oxidation treatment include known methods using an oxidizing agent of every kind such as Fe(III) ion treatment. As described previously, the oxidation treatment can be carried out after the exposure and development treatments of the emulsion layer or after the physical development or plating treatment. In addition, the oxidation treatment may be carried out after the development treatment and after the physical treatment or plating treatment, respectively.

[Pre-treatment of Plating]

In addition, the developed silver part after the exposure and development treatment can be treated with a solution containing Pd. Pd may be a divalent palladium ion or may be metallic palladium. According to this treatment, an electroplating or physical development rate can be accelerated.

In particular, in the case of plating a photosensitive material containing gelatin, it is preferable that hardening treatment is performed as its pre-treatment. Glutaraldehyde, alum, formaldehyde, and the like are preferably used as a film-hardener.

[Physical Development and Plating Treatment]

In the invention, for the purpose of imparting conductivity to the metallic silver part formed by the exposure and development treatment, physical development and/or plating treatment for supporting a conductive metal grain on the metallic silver part is carried out. In the invention, though it is possible to support a conductive metal grain on the metallic silver part by only one of physical development and plating treatment, a conductive metal grain can be supported on the metallic silver part by a combination of physical development and plating treatment. Incidentally, the metallic silver part to which physical development and/or plating treatment has been applied is called "conductive metal part".

The "physical development" as referred to in the invention means deposition of a metal grain on a nucleus of a metal or a metal compound upon reduction of a metal ion such as a silver ion with a reducing agent. This physical development is utilized in manufacture of instant black and white films, instant slide films, printing plates, and so on. Technologies used therein can be applied in the invention.

The physical development may be carried out simultaneously with the development treatment after the exposure or may be separately carried out after the development treatment.

In the invention, the plating treatment may be achieved by any of electroless plating (for example, chemical reduction plating and displacement plating) alone, electroplating alone or both of electroless plating and electroplating.

<Electroless Plating>

In the invention, the metallic silver part after the exposure and development treatment can be further treated with a solution for electroless plating. With respect to the electroless plating, a method of treating with a palladium compound aqueous solution and a method of treating with a reducing agent or a silver ion ligand or the both are preferable.

The former is carried out by treating the metallic silver part after the exposure and development treatment with a solution containing Pd. Pd may be a divalent palladium ion or may be metallic palladium. According to this treatment, an electroless plating or physical development rate can be accelerated. The electroless plating with palladium is described in detail in the chapter of "Electroless plating" of *Chemical Handbook, Applied Chemistry Edition*, edited by The Chemical Society of Japan.

In the case of performing the electroless plating, known electroless plating technologies can be employed. For example, an electroless plating technology which is employed in printed wiring boards or the like can be employed, and the electroless plating is preferably electroless copper plating.

Examples of chemical species contained in an electroless copper plating liquid include copper sulfate and copper chloride; examples of a reducing agent include formalin and glyoxalic acid; examples of a ligand of copper include EDTA and triethanolamine; and besides, examples of additives for the purpose of stabilizing a bath or improving the smoothness of a plated film include polyethylene glycol, yellow prussiate of potash, and bipyridine.

The treatment with a reducing agent or a silver ion ligand which is preferably employed in the invention is hereunder described.

Any reducing agent can be used so far as it is able to reduce a silver ion into metallic silver. Examples thereof include thiourea dioxide, Rongalit, tin(II) chloride, sodium borohydride, sodium acetoxyborohydride, trimethylaminoborane, triethylaminoborane, pyridineborane, and borane.

Examples of the silver ion ligand include halogen ions such as a chlorine ion, a bromine ion, and an iodine ion; pseudohalogen ions such as a thiocyanate ion; nitrogen-containing heterocyclic compounds such as pyridine and bipyridine; a sulfurous acid ion; meso-ionic compounds such as 1,2,4-triazolium-3-thiolates (for example, 1,2,4-trimethyl-1,2,4-triazolium-3-thiolate); and thioether compounds such as 3,6-dithiaoctane-1,8-diol.

It is preferable that the electroless plating treatment or the treatment with a reducing agent aqueous solution is carried out at the same treatment temperature as other immersion treatment steps; and the treatment time is from 10 to 1,000 seconds, and preferably from 20 to 200 seconds.

<Electroplating>

A preferred embodiment of the electroplating treatment method is specifically described below with reference with the accompanying drawing. A plating device for suitably carrying out the electroplating treatment is configured such that a film resulting from exposing and developing an emulsion layer, which is successively supplied from a supply reel (not illustrated) having the film wound therearound, is sent into an electroplating tank and plated, followed by successively taking up the plated film by a take-up reel (not illustrated).

FIG. 1 shows an embodiment of the electroplating tank which is suitably used in the electroplating treatment. An electroplating tank 10 as illustrated in this FIG. 1 is able to continuously plate a longitudinal film 16 (having been subjected to exposure and development treatment as described previously). Arrows show a delivery direction of the film 16. The electroplating tank 10 is provided with a plating bath 11 for storing a plating liquid 15. In the plating bath 11, one pair of anode plates 13 are disposed in parallel, and one pair of guide rollers 14 are disposed inside the anode plates 13 in parallel to the anode plates 13 in a rotatable manner. The guide rollers 14 are movable in a vertical direction so that a plating treatment time of the film 16 can be adjusted.

One pair of feed rollers (cathodes) 12a, 12b for not only guiding the film 16 into the plating bath 11 but also supplying a current to the film 16 are disposed in a rotatable manner in an upper part of the plating bath 11. Also, a liquid draining roller 17 is disposed in a lower part of the feed roller 12b of an outlet side in the upper part of the plating bath 11; and a water washing spray (not illustrated) for removing the plating liquid from the film 16 is arranged between this liquid draining roller 17 and the feed roller 12b of the outlet side.

The anode plates 13 are each connected to a plus terminal of an electric power unit (not illustrated) via an electric wire (not illustrated), and the feed rollers 12a, 12b are each connected to a minus terminal of an electric power unit (not illustrated).

In the electroplating tank 10, for example, in the case where the electroplating tank has a size of from 10 cm×10 cm×10 cm to 100 cm×200 cm×300 cm, a distance between a lowermost part of a face where the feed roller 12a of an inlet side and the film 16 come into contact with each other and a plating liquid level (a distance La as illustrated in FIG. 1) is preferably from 0.5 to 15 cm, more preferably from 1 to 10 cm, and further preferably from 1 to 7 cm. A distance between a lowermost part of a face where the feed roller 12b of the outlet side and the film 16 come into contact with each other and a plating liquid level (a distance Lb as illustrated in FIG. 1) is preferably from 0.5 to 15 cm.

Next, a method of forming a copper plated layer on a mesh-like silver fine line pattern of a film to strength the conductivity by using a plating device provided with the electroplating tank 10 is described.

First of all, the copper plating liquid 15 is stored in the plating bath 11. With respect to the plating liquid, in the case of copper plating, examples of a copper-supplying source compound include a copper plating liquid containing at least member of copper sulfate, copper cyanide, copper borofluoride, copper chloride, copper pyrophosphate, and copper carbonate. From the standpoints of inexpensive bath building costs, easiness of management and so on, it is preferred to use a plating liquid containing copper sulfate; and it is more preferred to use copper sulfate pentahydrate or a copper sulfate aqueous solution having copper sulfate pentahydrate dissolved in water in advance.

In the copper plating liquid, as a copper ion source other than those described above, a copper compound can be used without particular limitations so far as it is able to be dissolved in a usual acidic solution and to form an acidic copper plating liquid having a pH of not more than 3. Specific examples of the copper ion source other than those described above include copper oxide, copper alkanesulfonates (for example, copper methanesulfonate and copper propanesulfonate), copper alkanolsulfonates (for example, copper propanolsulfonate), and organic acid copper and salts thereof (for example, copper acetate, copper citrate, and copper tartarate). The copper compound can be used singly or in combination of two or more kinds thereof.

A copper ion concentration in the copper plating liquid is preferably in the range of from 150 to 300 g/L, more preferably in the range of from 150 to 250 mg/L, and further preferably in the range of from 180 to 220 g/L as reduced into a weight of copper sulfate pentahydrite.

In general, in the case of performing electroplating, the copper ion concentration in the plating liquid is often from 80 to 100 g/L. However, in the case of performing electroplating on a film with high surface resistivity as in the invention, since an electron is hardly spread over a wide area, the current density per unit area becomes high; the supply of a copper ion cannot keep up with the supply of an electron in a copper ion concentration within a usually employed range; hydrogen is generated on the film surface, whereby copper plating with poor quality (so-called "scorching") is deposited; and it is difficult to uniformly form a plated film without causing unevenness. Then, in the invention, it is preferable that the copper ion concentration in the plating liquid is 150 g/L or more; the generation of this "scorching" can be prevented; and a plated film can be uniformly formed without unevenness.

Incidentally, the reason why the preferred range of the copper ion concentration is defined to be not more than 300 g/L resides in the matters that even when the copper ion concentration exceeds 300 g/L, there are involved problems such that the effects do not substantially increase, and therefore, such is not economical; that it takes a lot of time for dissolution; and that copper is readily deposited.

An acid to be added in the plating liquid is not particularly limited so far as the pH of the plating liquid is kept sufficiently low, and examples thereof include sulfuric acid, nitric acid, and hydrochloric acid. Though the pH of this plating liquid varies with the concentration of the acid, it is preferably not more than 3, and more preferably not more than 1. Incidentally, when the pH of the acidic copper plating liquid exceeds 3, copper is readily deposited, and therefore, such is not preferable.

For example, in the case of using a plating liquid containing copper sulfate, a concentration of sulfuric acid in the plating liquid is preferably from 30 to 300 g/L, and more preferably from 50 to 150 g/L. Though the pH of this plating liquid varies with the concentration of sulfuric acid, it is preferably not more than 3, and more preferably not more than 1.

With respect to the copper plating liquid, it is preferable that a chlorine ion is present in the liquid. A concentration of the chlorine ion is preferably from 20 to 150 mg/L, and more preferably from 30 to 100 mg/L.

Next, organic additives which are added in the copper plating liquid are described. Examples of the organic additive include an organic compound capable of inhibiting plating reaction (plating inhibitor), an organic compound capable of accelerating plating reaction (plating accelerator) and an organic compound capable of flattening a metal film electrodeposited and formed during the course of plating (plating flattening agent). It is preferable that at least one compound selected among these organic compounds is contained; it is more preferable that a combination of two or more members thereof is contained; and in particular, it is the most preferable that all of an organic compound capable of inhibiting plating reaction, an organic compound capable of accelerating plating reaction and an organic compound capable of flattening the plating growth are added jointly.

As the organic compound capable of inhibiting plating reaction, a chain polymer containing a water-soluble group is preferable. The chain polymer may be branched. The polymer may be constituted of a single monomer or may be a copolymer of two or more monomers. As the water-soluble group, a hydroxyl group, a sulfuric acid group, a sulfurous acid group, a carboxyl group, and a phosphonic acid group are preferable, with a hydroxyl group being especially preferable. With respect to the polymer component, in particular, a polymer component containing an oxygen atom readily adsorbs onto the copper plated surface, thereby inhibiting the plating reaction. Such a polymer component is preferable because it readily adsorbs to parts outside pores where the plating reaction excessively progresses and selectively inhibits the plating reaction and the plating becomes uniformly minute.

As the polymer component, polyalkylene glycols are preferable. In that case, the carbon atom number of the alkylene group is preferably from 2 to 8, and more preferably from 2 to 3. Concretely, a compound selected from the group consisting of polyethylene glycol, polypropylene glycol, a polyethylene glycol/polypropylene glycol block copolymer type (pluronic type) surfactant, a polyethylene glycol/polypropylene glycol graft copolymer type (tetronic type) surfactant, a glycerin ether, and a dialkyl ether can be used. Of these, polyethylene glycol having a molecular weight of from 1,000 to 10,000, and more preferably from 2,000 to 6,000, polypropylene glycol having a molecular weight of from 100 to 5,000, and more preferably from 200 to 2,000, and a polyethylene glycol/polypropylene glycol block copolymer having a molecular weight of from 1,000 to 10,000, and more preferably from 1,500 to 4,000 are preferable; and polyethylene glycol having a molecular weight of from 2,000 to 6,000 is the most preferable. Incidentally, the chain polymer containing a water-soluble group can be used singly or in combination of two or more kinds thereof. A concentration of the polymer is preferably from 10 to 5,000 mg/L, and more preferably from 50 to 2,000 mg/L.

As the compound capable of accelerating plating reaction, a sulfur based organic compound containing a sulfur-containing group is preferable. Examples of the sulfur-containing group include a sulfide group, a thiol group (mercapto group), a sulfonic acid group, a sulfuric acid group, and a thiosulfuric acid group. By containing the sulfur based organic compound containing a sulfur-containing group, the plating reaction in a recess which is hardly plated is efficiently accelerated, whereby the plating becomes uniform and minute. Also, scratch resistance, heat resistance, and so on are improved. As a specific example of the sulfur based organic compound containing a sulfur-containing group, a compound selected from the group consisting of a sulfoalkyl sulfonic acid (the carbon atom number of the alkyl group is from 1 to 10, and preferably from 2 to 4) and a salt thereof and a bissulfo organic compound and a dithiocarbamic acid derivative, and thiosulfuric acid and a salt thereof can be used. Preferred specific examples thereof include bis(3-sulfopropyl) disulfide (SPS) and sodium mercapto-propanesulfonate (MPS). Besides, it is also preferred to use compounds enumerated in paragraph [0012] of JP-A-7-316875. Incidentally, the sulfur based organic compound may be used singly or in combination of two or more kinds thereof. A concentration of the sulfur based organic compound is preferably from 0.02 to 2,000 mg/L, and more preferably from 0.1 to 300 mg/L.

As the organic compound capable of flattening a metal-grown film electrodeposited during the course of plating, a nitrogen compound is preferable. By containing the nitrogen compound in the plating liquid, and preferably by using it together with the organic compound capable of inhibiting plating reaction, the nitrogen compound makes the inhibitory organic compound more diffusion-controlling and selectively adsorbs it to parts outside pores of the mesh-like pattern, whereby the plating is inhibited and the uniformity of the plating thickness is more improved.

As the nitrogen compound, a compound selected from the group consisting of a polyalkyleneimine, a 1-hydroxyethyl-2-alkylimidazoline salt, a polydialkylaminoethyl acrylate quaternary salt, a polyvinylpyridine quaternary salt, a polyvinylamidine, a polyallylamine, a polyamine sulfonic acid, Auramine and a derivative thereof, Methyl Violet and a derivative thereof, Crystal Violet and a derivative thereof, Janus Black and a derivative thereof, and Janus Green can be used. Incidentally, the nitrogen compound can be used singly or in combination of two or more kinds thereof. A concentration of the nitrogen compound is preferably from 0.1 to 1,000 mg/L, and more preferably from 0.5 to 150 mg/L.

In the case where the copper plating step is constituted of multiple stages of two stages or more, a concentration of the organic additives in the copper plating liquid in the second half part is preferably not more than 70%, and more preferably 50% based on a concentration of the organic additives added in the copper plating liquid in the first half part; and it is the most preferable that the organic additives are not substantially contained in the copper plating liquid in the second half part. What the organic additives are not substantially contained in the copper plating liquid in the second half part means that the addition of organic additives is not positively intentionally performed, except that a slight amount of the organic additives is carried over from the liquid of the preceding bath due to the treatment.

The sum of the total number of copper plating tanks is preferably from 2 to 40, more preferably 4 to 30, and especially preferably from 10 to 20. A ratio of the number of copper plating tanks in the second half part to the number of copper plating tanks in the first second half part is preferably from 0.5 to 2.0.

The bath temperature of the copper plating liquid is preferably from 15 to 40° C., and especially preferably from 20 to 35° C.

A stirring method of the copper plating liquid is not particularly limited, and generally employed aeration or ultrasonic stirring or other means may be employed. A temperature of water for water washing to be carried out after the copper plating is preferably 15 to 40° C., and especially from 20 to 30° C.

The film 16 is set up in a state that it is wound around a supply reel (not illustrated) and wound around a delivery roller (not illustrated) such that a surface of the film 16 in a side to be plated comes into contact with the feed rollers 12a, 12b. Incidentally, a surface resistivity of the film just before the electroplating is preferably in the range of from 1 to 1,000 Ω/sq, more preferably in the range of from 5 to 500 Ω/sq, and more preferably in the range of from 10 to 100 Ω/sq.

A voltage is applied to the anode plates 13 and the feed rollers 12a, 12b, and the film 16 is delivered while bringing it into contact with the feed rollers 12a, 12b. The film 16 is introduced into the plating bath 11 and dipped in the plating liquid 15 to form a copper plating. During the course of passing through the liquid draining roller 17, the copper plating liquid 15 attached to the film 16 is wiped off and recovered in the plating bath 11. This operation is repeated in plural electroplating tanks, and the film 16 is finally washed with water and then taken up by a take-up reel (not illustrated).

A delivery rate of the film 16 is set up within the range of from 1 to 30 m/min. The delivery rate of the film 16 is preferably in the range of from 1 to 10 in/min, and more preferably in the range of from 2 to 5 m/min.

An applied voltage is preferably in the range of from 1 to 100 V, and more preferably in the range of from 2 to 60 V. In the case where plural electroplating tanks are disposed, it is preferable that the applied voltage in the electroplating tank is decreased step by step. A current amount of the inlet side of the first tank is preferably from 1 to 30 A, and more preferably 2 to 10 A.

It is preferable that the feed rollers 12a, 12b come into to contact with the entire surface of the film (a portion which substantially comes into electrical contact with the film accounts for 80% or more of the contact area).

As an application of an electromagnetic shielding material of display, it is preferable that a thickness of the conductive metal part which is plated by the foregoing electroplating treatment is as thin as possible because a view angle of the display is widened. In addition, as an application of a conductive wiring material, in view of a demand for realizing high density, the film is required to be made thin. From these viewpoints, the thickness of the shielding film made of a plated conductive metal is preferably less than 9 μm, more preferably 0.1 μm or more and less than 5 μm, and further preferably 0.1 μm or more and less than 3 μm.

In the plating treatment of the invention, so far as the film just before the electroplating treatment is a film having a surface resistivity of from 1 to 1,000 Ω/sq, the film may be subjected to electroless plating treatment before that.

It is preferable that the conductive pattern on the film is continuous (not electrically interrupted). It is better that even a part of the conductive pattern is connected. When the conductive pattern is interrupted, there is a possibility that a portion where the plating is not deposited is formed in the first electroplating tank or that the plating becomes uneven.

With respect to a plating rate at the time of plating, the plating can be achieved under a mild condition, and high-speed plating of 5 μm/hr or more is possible, too. In the plating treatment, from the viewpoint of enhancing the stability of the plating liquid, for example, various additives such as ligands (for example, EDTA) can be added and used in the plating liquid.

[Rustproofing Treatment and Rustproofing Agent]

Next, rustproofing treatment which is preferably applied to the electromagnetic shielding film and a rustproofing agent to be contained in the film by the subject treatment are described.

In the invention, the rustproofing agent which is preferably contained in the electromagnetic shielding film may be contained in a photosensitive material which is a material for preparing a shielding film (for example, in an emulsion layer or in a surface protective layer); may be contained in a developing solution, a fixing solution or a stabilizing solution during pattern exposure and subsequent development treatment of the photosensitive material, whereby it is incorporated into the shielding film during the treatment; or may be contained in an electroplating liquid or an electroless plating liquid after the development treatment, an oxidizing liquid, or an independent rustproofing bath, whereby it is incorporated into the shielding film during the treatment. In particular, it is the most preferable that the rustproofing agent is incorporated into the film upon immersion in a rustproofing agent bath after blackening treatment as described later.

It is estimated that the rustproofing agent is adsorbed in a mesh-like fine line; and it is thought that the rustproofing agent exhibits rustproofing and stabilizing effects in that state, thereby bringing an effect for reducing a change of color taste after elapsing. When the rustproofing agent is adsorbed after forming the blackening layer of the invention, adsorption efficiency becomes remarkably high, thereby enabling one to adsorb a preferred adsorption amount of the rustproofing agent. The adsorption amount of the rustproofing agent is preferably from 0.01 to 0.5 $g/m^2$, and especially preferably from 0.03 to 0.3 $g/m^2$. When the adsorption amount is too low, an effect for controlling a change of color taste after elapsing becomes small, whereas when it is too high, the adhesion of the blackening layer is deteriorated.

As the rustproofing agent which is used in the invention, nitrogen-containing organic heterocyclic compounds and organic mercapto compounds are preferable, with nitrogen-containing organic heterocyclic compounds being especially preferable for use.

Preferred examples of the nitrogen-containing organic heterocyclic compound include 5-membered or 6-membered ring azoles. Of these, 5-membered ring azoles are especially preferable. Nitrogen-containing organic heterocyclic compounds and organic mercapto compounds are preferably used as the rustproofing agent to be used in the invention, A preferred nitrogen-containing 5-membered or 6-membered ring structure represents a non-metallic atomic group necessary for forming a 5-membered or 6-membered heterocyclic ring constituted from at least one atom of a carbon atom, a nitrogen atom, an oxygen atom, a sulfur atom, and a selenium atom. Incidentally, this heterocyclic ring may be fused with a carbon aromatic ring or a hetero aromatic ring.

Examples of the hetero ring include a tetraazole ring, a triazole ring, an imidazole ring, a thiadiazole ring, an oxadiazole ring, a selenadiazole ring, an oxazole ring, a thiazole ring, a benzoxazole ring, a benzthiazole ring, a benzimidazole ring, a pyrimidine ring, a triazaindene ring, a tetraazaindene ring, and a pentaazaindene ring. $R_{a1}$ represents a carboxylic acid or a salt thereof (for example, a sodium salt, a potassium salt, an ammonium salt, and a calcium salt), a sulfonic acid or a salt thereof (for example, a sodium salt, a potassium salt, an ammonium salt, a magnesium salt, and a calcium salt), a phosphonic acid or a salt thereof (for example, a sodium salt, a potassium salt, and an ammonium salt), a substituted or unsubstituted amino group (for example, unsubstituted amino, dimethylamino, diethylamino, methylamino, and bis-methoxyethylamino), or a substituted or unsubstituted ammonium salt (for example, trimethylammonium, triethylammonium, and dimethylbenzylammonium).

Such a ring may contain a substituent. Examples of the substituent include a nitro group, a halogen atom (for example, a chlorine atom and a bromine atom), a mercapto group, a cyano group, a substituted or unsubstituted alkyl group (for example, a methyl group, an ethyl group, a propyl group, a t-butyl group, and a cyanoethyl group), a substituted or unsubstituted aryl group (for example, a phenyl group, a 4-methanesulfonamidophenyl group, a 4-methylphenyl group, a 3,4-dichlorophenyl group, and a naphthyl group), a substituted or unsubstituted alkenyl group (for example, an allyl group), a substituted or unsubstituted (for example, a benzyl group, a 4-methylbenzyl group, and a phenethyl group), a substituted or unsubstituted sulfonyl group (for example, a methanesulfonyl group, an ethanesulfonyl group, and a p-toluenesulfonyl group), a substituted or unsubstituted carbamoyl group (for example, an unsubstituted carbamoyl group, a methylcarbamoyl group, and a phenylcarbamoyl group), a substituted or unsubstituted sulfamoyl group (for example, an unsubstituted sulfamoyl group, a methylsulfamoyl group, and a phenylsulfonyl group), a substituted or unsubstituted carbonamide group (for example, an acetamide group and a benzamide group), a substituted or unsubstituted sulfonamide group (for example, a methanesulfonamide group, a benzenesulfonamide group, and a p-toluenesulfonamide group), a substituted or unsubstituted acyloxy group (for example, an acetyloxy group and a benzoyloxy group), a substituted or unsubstituted sulfonyloxy group (for example, a methanesulfonyloxy group), a substituted or unsubstituted ureido group (for example, an unsubstituted ureido group, a methylureido group, an ethylureido group, and a phenylureido group), a substituted or unsubstituted acyl group (for example, an acetyl group and a benzoyl group), a substituted or unsubstituted oxycarbonyl group (for example, a methoxycarbonyl group and a phenoxycarbonyl group), a substituted or unsubstituted oxycarbonylamino group (for example, a methoxycarbonylamino group, a phenoxycarbonylamino group, and a 2-ethylhexyloxycarbonylamino group), and a hydroxyl group.

Plural substituents may be substituted on one ring.

Specific examples of the preferred nitrogen-containing organic heterocyclic compound are given below.

That is, examples include imidazole, benzimidazole, benzindazole, benzotriazole, benzoxazole, benzothiazole, pyridine, quinoline, pyrimidine, piperidine, piperazine, quinoxaline, and morpholine. These may contain a substituent such as an alkyl group, a carboxyl group, and a sulfo group.

Examples of the preferred nitrogen-containing 6-membered ring compound include compounds containing a triazine ring, a pyrimidine ring, a pyridine ring, a pyrroline ring, a piperidine ring, a pyridazine ring, or a pyrazine ring. Of these, compounds containing a triazine ring or a pyrimidine ring are preferable. Such a nitrogen-containing 6-membered ring compound may contain a substituent. In that case, examples of the substituent a lower alkyl group preferably having from 1 to 6 carbon atoms, and more preferably from 1 to 3 carbon atoms, a lower alkoxy group preferably having from 1 to 6 carbon atoms, and more preferably from 1 to 3 carbon atoms, a hydroxyl group, a carboxyl group, a mercapto group, an alkoxyalkyl group preferably having from 1 to 6 carbon atoms, and more preferably from 1 to 3 carbon atoms, and a hydroxyalkyl group preferably having from 1 to 6 carbon atoms, and more preferably from 1 to 3 carbon atoms.

Specific examples of the preferred nitrogen-containing 6-membered ring compound include triazine, methyltriazine, dimethyltriazine, hydroxyethyltriazine, pyrimidine, 4-methylpyrimidine, pyridine, and pyrroline.

Examples of the organic mercapto compound include alkylmercapto compounds, arylmercapto compounds, and heterocyclic mercapto compounds.

Examples of the alkylmercapto compound include cysteine and thiomalic acid; examples of the arylmercapto compound include thiosalicylic acid; and examples of the heterocyclic mercapto compound include 2-phenyl-1-mercaptotetrazole, 2-mercaptobenzimidazole, 2-mercaptobenzothiazole, 2-mercaptobenzoxazole, 2-mercaptopyrimidine, 2,4-dimercaptopyrimidine, and 2-mercaptopyridine. These compounds may contain a substituent such as an alkyl group, a carboxyl group, and a sulfo group.

As the rustproofing agent of the invention, benzotriazole, 5-methylbenzotriazole, 5-aminobenzotriazole, 5-chlorobenzotriazole, tetrazole, 5-aminotetrazole, 5-methyltetrazole, and 5-phenyltetrazole are especially preferable, with benzotriazole being the most preferable.

Such a rustproofing agent can be used singly or in admixture of two or more kinds thereof.

It is preferable that the rustproofing agent aqueous solution contains the rustproofing compound in a concentration of from 0.0001 to 0.1 moles, and preferably from 0.001 to 0.05 mole per liter. As a solubilizing agent of the rustproofing agent, an alcohol (for example, methanol, ethanol, and isopropanol) or a glycol (for example, diethylene glycol) can be added and used. Of these, methanol and ethanol are especially preferable. From the viewpoint of dissolving the rustproofing agent, a pH of the aqueous solution is preferably adjusted at from 2 to 12, and especially preferably from 4 to 8. The pH can be adjusted by using a usual acid or alkali such as sodium hydroxide and sulfuric acid. Besides, phosphoric acid and a salt thereof, a carboxylic acid salt, acetic acid and a salt thereof, boric acid and a salt thereof, and the like can be used as a buffer.

[Blackening Treatment and Blackening Layer]

The conductive film of the invention (for example, the transparent electromagnetic shielding film) and an optical filter having this conductive film incorporated thereinto are subjected to a blackening treatment.

In the blackening treatment of the invention, a blackening layer containing at least nickel and zinc in an Ni/Zn mass ratio in the range of from 0.5 to 50 is provided on a surface of the conductive metal. The Ni/Zn mass ratio is more preferably from 0.8 to 20, further preferably from 0.5 to 2.0, and especially preferably from 0.8 to 1.2.

Also, with respect to the configuration of the conductive metal layer (at this time, the conductive metal layer includes the blackening layer), it is preferred to adjust a total amount of conductive metals and an amount of the blackening layer such that the total amount of conductive metals is from 0.2 to 10.0 $g/m^2$ and that the total sum of nickel and zinc of the blackening layer is from 0.06 to 5.0 $g/m^2$. It is more preferable that the total amount of conductive metals is from 1.0 to 7.0 $g/m^2$ and that the total sum of nickel and zinc is from 0.10 to 2.0 $g/m^2$.

When the total amount of conductive metals is excessively low, the surface resistivity value becomes large so that a preferred electromagnetic shielding ability is not obtainable, whereas when it is excessively high, the light transmission properties are lowered and the haze becomes high, and therefore, such is not preferable. When the total sum of nickel and zinc of the blackening layer is excessively low, the change of color taste with time becomes large, whereas when it is excessively high, the adhesion is deteriorated, and therefore, such is not preferable.

Metallic species constituting the conductive metal layer are preferably composed of from 0.05 to 2.0 g/m² of silver, from 0.2 to 5.0 g/m² of copper, from 0.06 to 2.0 g/m² of nickel, and from 0.06 to 2.0 g/m² of zinc; and more preferably composed of from 0.1 to 1.0 g/m² of silver, from 1.0 to 4.0 g/m² of copper, from 0.08 to 1.0 g/m² of nickel, and from 0.08 to 1.0 g/m² of zinc.

For the purpose of forming the conductive metal layer inexpensively and easily, it is preferred to apply silver development. In order to achieve this, the amount of silver is preferably 0.05 g/m² or more; and when the amount of silver is more than 2.0 g/m², the light transmission properties are lowered and the costs are not cheap, and therefore, such is not preferable. Copper is preferable because it is cheap and is able to lower the surface resistivity. When the amount of copper is less than 0.2 g/m², a preferred surface resistivity value is not obtainable, whereas when it exceeds 5.0 g/m², the light transmission properties are lowered and the haze becomes large, and therefore, such is not preferable. When the mass ratios of nickel and zinc fall within the ranges of the invention, the effects of the invention are obtainable. When the amount of nickel or zinc is less than 0.06 g/m², the change of color taste after elapsing becomes large, and therefore, such is not preferable. On the other hand, when the amount of nickel or zinc exceeds 2.0 g/m², the adhesion of the blackening layer is deteriorated and the light transmission properties are lowered, and therefore, such is not preferable.

It is especially preferable that the conductive metal layer in a pattern-like state is a laminated constitution of two layers of silver and copper obtained by adjusting an applied voltage and a composition of the electrolytic solution such that copper is selectively electrodeposited on an upper surface of mesh-like developed silver (surface in an opposite side to the support); and that plating is performed such that the silver layer is positioned in the support side, thereby additionally providing a blackening layer.

A width of the mesh line after performing up to the blackening treatment is preferably from 5 to 30 μm, and more preferably from 8 to 20 μm. A pitch interval of the mesh is preferably from 50 to 600 μm, and especially preferably from 100 to 400 m. In order to enhance the light transmittance, it is preferable that the light width is thin and that the pitch interval is wide. Since the electromagnetic shielding ability is in a trade-off relationship, the foregoing optimum range is determined. The line width may be uniform; points of intersection may be thick; and inversely, points of intersection may be thin, with a central part of the line between the points of intersection being thick. In the case of using the conductive metal layer as an electromagnetic shielding film for PDP, the lattice-like pattern of the mesh has an angle against the end faces of the film of from 30 to 70°, and especially preferably from 40 to 65°. Instead of the lattice-like pattern, the mesh can also take a radial form such as a cobweb. In all of these cases, it is required that the blackening layer of the invention be present.

Next, the blackening layer forming step of the invention is described. The blackening layer forming step is to form a blackening layer having a mass ratio of nickel and zinc of the blackening layer satisfied with the following formula (1) on the foregoing plating layer (conductive metal layer) by using a plating liquid containing nickel and zinc.

$$Ni:Zn=0.5:1 \text{ to } 50:1 \tag{1}$$

It is preferable that in the blackening layer forming step, the foregoing blackening layer is formed in two or more stages by using a first blackening plating liquid containing nickel and zinc and a second blackening plating liquid containing nickel and zinc, with a content ratio of nickel in the first placing liquid being larger than a content ratio of nickel in the foregoing second plating liquid. At this time, the blackening layer is composed of two or more layers. With respect to the blackening layer composed of two or more layers, in the blackening layer of a surface layer, the zinc content is larger than the content of nickel.

In the case where the blackening layer is formed in two or more stages, from the viewpoint of suppressing the poor appearance, a content molar ratio of nickel and zinc of the foregoing first plating liquid is preferably satisfied with the following formula (2), and more preferably satisfied with the following formula (2-a).

$$Ni:Zn=10:1 \text{ to } 100:1 \tag{2}$$

$$Ni:Zn=20:1 \text{ to } 60:1 \tag{2-a}$$

Also, a content molar ratio of nickel and zinc of the second plating liquid is preferably satisfied with the following formula (3), and more preferably satisfied with the following formula (3-a).

$$Ni:Zn=1:1 \text{ to } 20:1 \tag{3}$$

$$Ni:Zn=2:1 \text{ to } 10:1 \tag{3-a}$$

As a supply source of nickel in the plating liquid, nickel sulfate, nickel chloride, and nickel nitrate are preferable; and as a supply source of zinc, zinc sulfate, zinc chloride, and zinc nitrate are preferable. Above all, nickel sulfate and zinc sulfate are especially preferable for use. The addition amount is preferably from 50 to 200 g/L, and more preferably from 80 to 150 g/L as nickel sulfate hexahydrate; and preferably from 1 to 50 g/L, and more preferably from 2 to 35 g/L as zinc sulfate heptahydrate, respectively. Sodium thiocyanate, potassium thiocyanate and ammonium thiocyanate are preferable for use, with ammonium thiocyanate being especially preferable. The addition amount of ammonium thiocyanate is preferably from 8 to 30 g/L, and more preferably from 12 to 20 g/L. Additives known as a gloss agent of the nickel plating liquid, such as naphthalenesulfonic acid salts, saccharin, 1,4-butinediol, and propargyl alcohol and surfactants as a pit preventing agent such as sodium laurylsulfate can also be added and used.

It is possible to change the nickel/zinc ratio of the blackening layer by a ratio of nickel and zinc in the blackening treatment liquid and an ammonia concentration. By changing a ratio of sodium and ammonium while keeping the concentration of thiocyanic acid constant, the nickel/zinc ratio of the blackening layer increases with an increase of the ammonia concentration.

A pH of the blackening treatment liquid is preferably from 3.0 to 6.5, and more preferably from 4.0 to 6.0. When the pH is low, the generation of hydrogen at the time of blackening treatment increases; the plating efficiency is lowered; and especially, the electrodeposition amount of zinc is lowered, and the nickel/zinc ratio increases. On the other hand, when the pH is high, nickel hydroxide is easily deposited, and therefore, such is not preferable. It is preferable that the treatment is carried out while adjusting the pH by adding sodium hydroxide, potassium hydroxide, ammonia water, or the like such that the pH does not change by the blackening treatment. At that time, for the purpose of preventing precipitation of nickel hydroxide from occurring, it is preferable that an alkali diluted to 0.1 to 2N is added and that the addition is performed while well stirring a place to be added. For the purpose of minimizing the pH change, it is also preferred to use a compound having a pKa at a pH of from 3 to 7 as a buffer. Succinic acid, citric acid, and the like are especially preferable for stably forming the blackening layer.

A temperature of the blackening treatment liquid is preferably from 20 to 60° C., and more preferably from 25 to 40° C. As the stirring of the liquid, generally well known air stirring, jet stirring for injecting the liquid from a small nozzle, and stirring while circulating a tank liquid are preferable.

As an anode electrode for the blackening treatment, though nickel, carbon, and the like can be used, in view of the point of suppressing a deposit in the blackening liquid and the deposition of a white stain caused thereby, it is preferred to use a nickel electrode. In this case, though in particular, a concentration of zinc is reduced by the blackening treatment, it is preferred to perform the blackening treatment while replenishing a replenisher having been prepared in an amount adding a reduced amount due to the electrodeposition such that the concentration is always constant, or supplying a reduced amount by occasionally analyzing it.

As the nickel electrode, a nickel plate or a nickel chip contained in a titanium-made basket can be used.

In the case of using a nickel anode, since the pH becomes high due to the plating treatment, it is preferred to adjust the pH with an acid such as sulfuric acid and hydrochloric acid. In this case, since nickel hydroxide due to the addition of an alkali is not generated, staining in the liquid or the deposition of a stain on the film is small.

A current density (current value/area of mesh film in the liquid) on a cathode surface of the blackening treatment is from 0.1 to 5 A/dm$^2$, and preferably from 0.2 to 1 A/dm$^2$. In the case of a continuous blackening treatment, a line speed is preferably from 0.1 to 30 m/min, and especially preferably from 0.5 to 10 m/min. When the current density is high, the nickel/zinc ratio tends to become small. Also, the amounts of nickel and zinc can be controlled by a total current amount in the blackening treatment; and the nickel/zinc ratio can also be changed without changing the plating amount by making the current density small and making the line speed slow corresponding thereto, or by increasing the number of blackening treatment baths.

In the case where the foregoing electromagnetic shielding film according to the invention is prepared by an etching resist pattern, though the resist pattern may be removed after the blackening treatment, it is preferable that even before the treatment, after removing the etching resist pattern, the surface of the remaining conductive metal layer is subjected to the foregoing blackening treatment.

3. Optically Transparent Electromagnetic Shielding Film and Optical Filter:

An optically transparent conductive film having a blackened silver mesh pattern obtained by exposing, developing, plating and blackening treating a photosensitive material containing a silver salt emulsion is obtained in the foregoing manner.

Since this optically transparent conductive film has high electromagnetic shielding properties and optically transparent properties, it can be used as an electromagnetic shielding film by incorporating into CRT, EL, liquid crystal display, plasma display panel, other image display flat panel, imaging semiconductor integrated circuit represented by CCD, or the like. The application of the conductive metal layer according to the invention is not limited to the foregoing display devices.

The conductive metal layer according to the invention can be provided in a window or a casing for viewing the inside of a measurement unit, a measurement appliance or a manufacturing unit which emits an electromagnetic wave, a window of a building which possibly receives electromagnetic interference by a radio tower, a high-voltage cable, or the like, an automobile window, or the like.

In the optically transparent conductive film according to the invention, the silver mesh is formed of developed silver, the conductivity is strengthened by plating, and the visibility is improved by blackening. Accordingly, the fine line pattern is precise, the luminance is not remarkably impaired, and the image quality can be kept or improved. Thus, the optically transparent conductive film according to the invention is especially useful as an optically transparent electromagnetic shielding film which is used in front of an image display device such as a plasma display panel.

Incidentally, for the purpose of not lowering an electromagnetic shielding ability of the optically transparent electromagnetic shielding film, it is desirable that a conductive metal part is grounded. In order to attain this purpose, it is desirable that a continuity part for grounding the optically transparent electromagnetic shielding film and that this continuity part is brought into electrical contact with a grounding part of the display main body. It is suitable that the continuity part is provided in the surroundings of a metallic silver part or a conductive metal part along the periphery of the optically transparent electromagnetic shielding film.

The continuity part may be formed of a mesh pattern or may be formed of, for example, a non-patterned solid metal foil. However, for the purpose of improving the electrical contact with the grounding part of the display main body, it is preferable that the continuity part is not patterned as in a solid metal foil.

In the case of using the optically transparent electromagnetic conductive film according to the invention as an optically transparent electromagnetic shielding film, it is preferred to prepare a form of an optical film by sticking an adhesive layer, a glass plate, a protective film as described later, a functional film, or the like on the optically transparent conductive film (optically transparent electromagnetic shielding film). Respective layers which can be provided on the optically transparent conductive film (optically transparent electromagnetic shielding film) are hereunder described.

<Adhesive Layer>

A position of the optically transparent electromagnetic shielding film at which an adhesive layer is provided may be a face in the side where the conductive metal part is formed or may be a face in the side opposite to the side where the conductive metal part is formed. The adhesive layer may be formed in a sticking portion between the optically transparent electromagnetic shielding film and other layer (for example, a glass plate, a protective film, and a functional film). A thickness of the adhesive layer is preferably the thickness of the metallic silver part (or the conductive metal part) or more, for example, in the range of from 10 to 80 μm, and more preferably from 20 to 50 μm.

A refractive index of an adhesive in the adhesive layer is preferably from 1.40 to 1.70. By controlling the refractive index at from 1.40 to 1.70, it is possible to minimize a difference between the refractive index of the support of the optically transparent electromagnetic shielding film and the refractive index of the adhesive and to prevent a lowering of the visible light transmittance.

The adhesive is preferably an adhesive capable of flowing upon heating or pressurization. The adhesive is especially preferably an adhesive exhibiting fluidity upon heating at not higher than 200° C. or pressurization at 1 kgf/cm² (0.1 MN/m²) or more.

By using such an adhesive, it is possible to make the optically transparent electromagnetic shielding film adhere to a display or a plastic plate as an adherend while flowing the adhesive layer. Accordingly, it is possible to make the optically transparent electromagnetic shielding film easily adhere to even an adherend having a curved surface or a complicated shape by lamination or pressure molding, especially pressure molding.

In order to achieve this, it is preferable that the adhesive has a softening temperature of not higher than 200° C. From the standpoint of the application of the optically transparent electromagnetic shielding film, since the environment to be used is usually lower than 80° C., the softening temperature of the adhesive layer is preferably 80° C. or higher, and most preferably from 80 to 120° C. in view of workability. The softening temperature refers to a temperature at which the viscosity becomes not higher than $10^{12}$ poises ($10^3$ MPa·s). In general, fluidization is admitted within a time of from approximately 1 to 10 seconds at that temperature.

As the adhesive capable of flowing upon heating or pressurization, the following thermoplastic resins are mainly enumerated as representative examples thereof. Examples of the adhesive which can be used include natural rubber (refractive index n=1.52), (di)enes such as polyisoprene (n=1.521), poly-1,2-butadiene (n=1.50), polyisobutene (n=1.505 to 1.51), polybutene (n=1.513), poly-2-heptyl-1,3-butadiene (n=1.50), poly-2-t-butyl-1,3-butadiene (n=1.506), and poly-1,3-butadiene (n=1.515), polyoxyethylene (n=1.456), polyoxypropylene (n=1.450), polyethers such as polyvinyl ethyl ether (n=1.454), polyvinyl hexyl ether (n=1.459), and polyvinyl butyl ether (n=1.456), polyesters such as polyvinyl acetate (n=1.467) and polyvinyl propionate (n=1.467), polyurethane (n=1.5 to 1.6), ethyl cellulose (n=1.479), polyvinyl chloride (n=1.54 to 1.55), polyacrylonitrile (n=1.52), polymethacrylonitrile (n=1.52), polysulfone (n=1.633), polysulfide (n=1.6), phenoxy resins (n=1.5 to 1.6), and poly(meth) acrylic esters such as polyethyl acrylate (n=1.469), polybutyl acrylate (n=1.466), poly-2-ethylhexyl acrylate (n=1.463), poly-t-butyl acrylate (n=1.464), poly-3-ethoxypropyl acrylate (n=1.465), polyoxycarbonyl tetramethylene (n=1.465), polymethyl acrylate (n=1.472 to 1.480), polyisopropyl methacrylate (n=1.473), polydodecyl methacrylate (n=1.474), polytetradecyl methacrylate (n=1.475), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.487), poly-1,1-diethylpropyl methacrylate (n=1.489), and polymethyl methacrylate (n=1.489). Such an acrylic polymer may be used as a copolymer of two or more kinds thereof or a blend of two or more kinds thereof as the need arises.

In addition, examples of the copolymer resin of an acrylic resin and a substance other than the acrylic resin which can be used include epoxy acrylate (n=1.48 to 1.60), urethane acrylate (n=1.5 to 1.6), polyether acrylate (n=1.48 to 1.49), and polyester acrylate (n=1.48 to 1.54). In view of adhesiveness, urethane acrylates, epoxy acrylates and polyether acrylates are excellent. Examples of the epoxy acrylate include (meth) acrylic acid adducts such as 1,6-hexanediol diglycidyl ether, neopentyl glycol diglycidyl ether, allyl alcohol diglycidyl ether, resorcinol diglycidyl ether, diglycidyl adipate, diglycidyl phthalate, polyethylene glycol diglycidyl ether, trimethylolpropane triglycidyl ether, glycerin triglycidyl ether, pentaerythritol tetraglycidyl ether, and sorbitol tetraglycidyl ether. A polymer containing a hydroxyl group in a molecule thereof such as epoxy acrylates is effective for improving the adhesiveness. Such a copolymer resin can be used in combination of two or more kinds thereof as the need arises.

On the other hand, as the adhesive polymer, one having a weight average molecular weight (measured by using a calibration curve of standard polystyrene by gel permeation chromatography; hereinafter the same) of 500 or more is preferably used. When the molecular weight is less than 500, since a cohesive power of the adhesive composition is too low, the adhesion to an adherend is possibly lowered.

A hardener (crosslinking agent) can be contained in the adhesive. Examples of the hardener of the adhesive which can be used include amines such as tri-ethylenetetramine, xylenediamine, and diaminodiphenylmethane, acid anhydrides such as phthalic anhydride, maleic anhydride, dodecylsuccinic anhydride, pyromellitic anhydride, and benzophenonetetracarboxylic anhydride, diaminodiphenylsulfone, tris(dimethylaminomethyl)phenol, polyamide resins, dicyanediamide, and ethylmethylimidazole. Such a compound may be used singly or in admixture of two or more kinds thereof.

The addition amount of the hardener is chosen within the range of from 0.1 to 50 parts by weight, and preferably from 1 to 30 parts by weight based on 100 parts by weight of the adhesive polymer. When the addition amount of the hardener is less than 0.1 parts by weight, the hardening becomes insufficient, whereas when it exceeds 50 parts by weight, excessive crosslinking occurs, thereby possibly adversely affecting the adhesiveness.

In addition to the film-hardener, the adhesive may be blended with additives such as a diluent, a plasticizer, an antioxidant, a filler, a colorant, an ultraviolet ray absorber, and a tackifier as the need arises.

In order to form an adhesive layer on the optically transparent electromagnetic shielding film, the adhesive layer can be formed by coating an adhesive composition containing the adhesive polymer and hardener and besides, other additives on a part or the entire surface of the conductive metal part, followed by drying the solvent and heating for hardening.

<Protective Film>

A protective film can be stuck on the optically transparent electromagnetic shielding film according to the invention. The protective film may be provided on the both surfaces of the optically transparent electromagnetic shielding film or may be provided on only one surface thereof (for example, on the conductive metal part).

As described later, in the optically transparent electromagnetic shielding film, a functional film having an effect for strengthening the outermost surface, imparting antireflection properties or imparting antifouling properties or other effect is often stuck. Thus, in the case of providing such a functional film on the optically transparent electromagnetic shielding film, it is desired to peel away the protective film. Accordingly, the protective film is desirably one which can be peeled away.

A peel strength of the protective film is preferably from 5 mN/25 mm in width to 5 N/25 mm in width, and more preferably from 10 mN/25 mm in width to 100 mN/25 mm in width. When the peel strength of the protective film is less than the lower limit, the peeling is too easy and the protective film is possibly peeled away during the course of handling or due to careless contact, and therefore, such is not preferable. Also, when it exceeds the upper limit, not only a large force for achieving the peeling is required, but also a mesh-like metal foil is possibly peeled away from the transparent substrate film (or the adhesive layer) during the peeling, and therefore, such is not preferable, too.

As the film constituting the protective film, it is preferable that a resin film, for example, polyolefin based resins such as polyethylene resins and polypropylene resins, polyester resins such as polyethylene terephthalate resins, polycarbonate resins, and acrylic resins is used. Also, it is preferable that corona discharge treatment is applied on or an easily adhesive layer is stacked on the sticking surface of the protective film.

<Functional Film>

In the case of using the optically transparent electromagnetic shielding film in a display (especially a plasma display), it is preferable that a functional film having functionality described below is stuck, thereby imparting each functionality thereto. The functional film can be stuck on the optically transparent electromagnetic shielding film via an adhesive or the like.

(Antireflection Properties and Antiglare Properties)

It is preferable that any one of functionalities including antireflection (AR) properties for inhibiting reflection of external light, antiglare (AG) properties for preventing reflection of a mirror image, and antireflection and antiglare (ARAG) properties provided with the both characteristics is imparted to the optically transparent electromagnetic shielding film.

By these performances, it is possible to prevent a phenomenon that a display screen is hardly viewed due to reflection of an illuminator or the like from occurring. Also, by lowering a visible light reflectance on the film surface, not only the reflection can be prevented, but also the contrast or the like can be improved. In the case of sticking a functional film having antireflection properties and antiglare properties on the optically transparent electromagnetic shielding film, the visible light reflectance is preferably not more than 2%, more preferably not more than 1.3%, and further preferably not more than 0.8%.

The foregoing functional film can be formed by providing a functional layer having antireflection properties and antiglare properties on an appropriate transparent substrate.

The antireflection layer can be formed of a single layer of a thin film made of, for example, a fluorocarbon based transparent high molecular weight resin, a magnesium fluoride or silicon based resin, or silicon oxide in an optical film thickness of, for example, a ¼ wavelength, a multilayered stack of two or more layers of thin films having a different refractive index from each other and made of an inorganic compound (for example, metal oxides, fluorides, silicides, nitrides, and sulfides) or an organic compound (for example, silicon based resins, acrylic resins, and fluorocarbon based resins), or the like.

The antiglare layer can be formed of a layer having a finely irregular surface state of from approximately 0.1 µm to 10 µm. Concretely, the antiglare layer can be formed by coating and hardening an ink formed by dispersing a particle of an inorganic compound or an organic compound such as silica, an organosilicon compound, a melamine based resin, and an acrylic resin in a thermocurable or photocurable resin such as an acrylic resin, a silicon based resin, a melamine based resin, a urethane based resin, an alkyd based resin, and a fluorocarbon based resin. The particle preferably has an average particle size of from approximately 1 to 40 µm.

The antiglare layer can also be formed by coating the thermocurable or photocurable resin and then pressing a mold having a desired gloss value or surface state, followed by hardening.

In the case of providing the antiglare layer, a haze of the optically transparent electromagnetic shielding film is preferably 0.5% or more and not more than 20%, and more preferably 1% or more and not more than 10%. When the haze is excessively low, the antiglare properties are insufficient, whereas when the haze is excessively high, a visibility of the transmitted image tends to become low.

(Hard Coat Properties)

In order to add scratch resistance to the optically transparent electromagnetic shielding film, it is suitable that the functional film has hard coat properties. The hard coat layer is made of, for example, a thermocurable or photocurable resin such as acrylic resins, melamine based resins, urethane based resins, alkyd based resins, and fluorocarbon based resins. Its kind and formation method are not particularly limited. A thickness of the hard coat layer is preferably from approximately 1 to 50 µm. When the antireflection layer and/or the antiglare layer is formed on the hard coat layer, a functional film having scratch resistance, antireflection properties and/or antiglare properties is obtainable, and therefore, such is suitable.

A surface hardness of the optically transparent electromagnetic shielding film having hard coat properties imparted thereto is preferably at least H, more preferably 2H or more, and further preferably 3H or more in terms of a pencil hardness according to JIS K-5400.

(Antistatic Properties)

For the purpose of preventing the attachment of dusts due to electrostatic charge or electrostatic discharge due to contact with a human body, it is preferable that antistatic properties are imparted to the optically transparent electromagnetic shielding film.

As the functional film having antistatic properties, a film having high conductivity can be used, and for example, the film has conductivity of not more than approximately $10^{11}$ Ω/sq in terms of a surface resistivity.

The film having high conductivity can be formed by providing an antistatic layer on the transparent substrate. Specific examples of an antistatic agent which is used in the antistatic layer include PELESTAT (a trade name, manufactured by Sanyo Chemical Industries, Ltd.) and ELECTRO STRIPPER (a trade name, manufactured by Kao Corporation). Besides, the antistatic layer may be formed of a known transparent conductive film inclusive of ITO or a conductive film having a conductive ultrafine particle (inclusive of an ITO ultrafine particle and a tin oxide ultrafine particle) dispersed therein. The antistatic properties may be imparted by containing a conductive fine particle in the hard coat layer, the antireflection layer, the antiglare layer, or the like.

(Antifouling Properties)

What the optically transparent electromagnetic shielding film has antifouling properties is suitable because the attachment of a foul such as fingerprints can be prevented from occurring, or even when a foul is attached, the foul can be simply removed.

A functional film having antifouling properties is, for example, obtained by imparting a compound having antifouling properties on the transparent substrate. The compound having antifouling properties may be a compound having non-wetting properties against water and/or fats and oils, and examples thereof include fluorine compounds and silicon compounds. Specific examples of the fluorine compound include OPTOOL (a trade name, manufactured by Daikin Industries, Ltd.); and specific examples of the silicon compound include TAKATA QUANTUM (a trade name, manufactured by NOF Corporation).

(Ultraviolet Ray Cutting Properties)

For the purpose of preventing the deterioration of a dye as described later or the transparent substrate, it is preferred to impart ultraviolet ray cutting properties to the translucent electromagnetic shielding film. A functional film having ultraviolet ray cutting properties can be formed by a method of containing an ultraviolet ray absorber in the transparent substrate per se or by providing an ultraviolet ray absorbing layer on the transparent substrate.

With respect to an ultraviolet ray cutting ability necessary for protecting the dye, a transmittance of an ultraviolet ray region shorter than a wavelength of 380 nm is not more than 20%, preferably not more than 10%, and more preferably not more than 5%. The functional film having ultraviolet ray cutting properties is obtained by forming a layer containing an ultraviolet ray absorber or an inorganic compound capable of reflecting or absorbing ultraviolet rays on the transparent substrate. As the ultraviolet ray absorber, compounds which have hitherto been known, such as benzotriazole based compounds and benzophenone based compounds, can be used. The kind and concentration thereof are determined by dispersibility or solubility in a medium for dispersing or dissolving it, absorption wavelength or absorption coefficient, thickness of a medium, and so on and are not particularly limited.

Incidentally, it is preferable that the functional film having ultraviolet ray cutting properties is low in absorption of a visible light region, is free from a remarkable lowering of the visible light transmittance and is not colored yellow or the like.

In the case where a layer containing a dye as described later is formed in the functional film, it is desirable that a layer having ultraviolet ray cutting properties is present outside of that layer.

(Gas Barrier Properties)

When the optically transparent electromagnetic shielding film is used in the environment of higher temperature and humidity than the normal temperature and humidity, there may be possibilities that a dye as described later is deteriorated due to the moisture; that the moisture is coagulated in the adhesive used for sticking or on the sticking interface, thereby causing cloudiness; and that the adhesive is phase separated and deposited due to the influence by the moisture, thereby causing cloudiness. Accordingly, it is preferable that the optically transparent electromagnetic shielding film has gas barrier properties.

In order to prevent such deterioration of the dye or cloudiness, it is important to prevent penetration of the moisture into the layer containing a dye or the adhesive layer. It is suitable that a water vapor transmissibility of the functional film is not more than 10 $g/m^2 \cdot day$, and preferably not more than 5 $g/m^2 \cdot day$.

(Other Optical Characteristics)

Since a plasma display emits strong near infrared rays, in particular, in case of using the optically transparent electromagnetic shielding film in a plasma display, it is preferred to impart infrared ray shielding properties (especially near infrared ray shielding properties).

A transmittance of a functional film having near infrared ray cutting properties in a wavelength region of from 800 to 1,000 nm is not more than 25%, more preferably not more than 15%, and further preferably not more than 10%.

In the case of using the optically transparent electromagnetic shielding film in a plasma display, it is preferable that its transmitted color is neutral gray or blue gray. This is because the light emission characteristics and contrast of the plasma display are kept or improved and a white color of the color temperature which is slightly higher than the standard white color is often preferred.

In addition, a color plasma display is not laid in a state that its color reproducibility is sufficiently satisfactory; and in particular, an emission spectrum of red display exhibits several emission peaks over a wavelength of from approximately 580 nm to 700 nm, thereby causing a problem that the red light emission becomes closed to an orange color with poor color purity due to relatively strong emission peaks in a short wavelength side. Then, it is preferable that the functional film has a function to selectively reduce unnecessary light emission from a phosphor or a discharge gas as a cause thereof.

These optical characteristics can be controlled by using a dye. Namely, a near infrared ray absorber is used for the purpose of cutting near infrared rays; and a dye capable of selectively absorbing unnecessary light emission is used for the purpose of reducing the unnecessary light emission, thereby enabling one to bring desired optical characteristics. The color tone of the optical filter can be made suitable by using a dye having appropriate absorption in a visible light region.

As the dye, general dyes or pigments having a desired absorption wavelength in a visible region and compounds which are known as a near infrared ray absorber can be used. The kind of the dye is not particularly limited, and examples thereof include organic dyes which are in general commercially available, such as anthraquinone based compounds, phthalocyanine based compounds, methine based compounds, azomethine based compounds, oxazine based compounds, imonium based compounds, azo based compounds, styryl based compounds, coumarin based compounds, porphyrin based compounds, dibenzofuranone based compounds, diketopyrrolopyrrole based compounds, rhodamine based compounds, xanthene based compounds, pyrromethene based compounds, dithiol based compounds, and diiminium based compounds.

When the temperature of a panel surface of the plasma display is high and the temperature of the environment is high, the temperature of the optically transparent electromagnetic shielding film increases, too. Accordingly, it is suitable that the dye has heat resistance such that it is not deteriorated at, for example, approximately 80° C.

Some dyes have poor light fastness. In the case where by using such a dye, the deterioration due to light emission of the plasma display or ultraviolet rays or visible light rays as external light becomes problematic, it is preferred to prevent the deterioration of the dye due to ultraviolet rays or visible light rays by containing an ultraviolet ray absorber in the functional film or providing a layer which does not transmit ultraviolet rays as described previously.

The same is also applicable in the environment of, in addition to the heat and light, humidity or a combination thereof. When the deterioration occurs, transmission characteristics of the optical filter are changed. Thus, there may be possibilities that the color tone changes and that a near infrared ray cutting ability is lowered.

In order to dissolve or disperse the dye in a resin composition for forming a transparent substrate or a coating composition for forming a coating layer, it is preferable that the dye has high solubility or dispersibility in a solvent.

A concentration of the dye can be properly set up depending upon the absorption wavelength and absorption coefficient of the dye, the transmission characteristics and transmittance required for the optically transparent electromagnetic shielding film and the kind and thickness of a medium or a film into which the dye is dispersed.

In the case of containing a dye in the functional film, the dye may be contained inside the transparent substrate, or a layer containing a dye may be coated on a surface of the substrate. Furthermore, the dye may be contained in an adhesive layer. Moreover, two or more kinds of dyes having a different absorption wavelength from each other may be mixed and contained in one layer. Two or more layers containing a dye may be provided.

The dye may possibly be deteriorated upon contact with a metal. Accordingly, in the case of using such a dye, it is more preferable that the functional film containing a dye is disposed in such a manner that the layer containing a dye does not come into contact with the conductive metal part on the optically transparent electromagnetic shielding film.

Embodiment

The invention is more specifically described below with reference to the following Examples. Incidentally, materials, use amounts, proportions, treatment contents, treatment procedures, and so on shown in the following Examples can be properly altered so far as the gist of the invention is not deviated. Accordingly, it should not be construed that the scope of the invention is limited by the following specific examples.

EXAMPLE 1

(Preparation of Silver Halide Photosensitive Material)

An emulsion containing 10.0 g of gelatin based on 60 g of Ag in an aqueous medium and containing a silver iodobromochloride grain (I=0.2% by mole, Br=40% by mole) having a sphere-corresponding average grain size of 0.1 μm was prepared.

Also, $K_3Rh_2Br_9$ and $K_2IrCl_6$ were added in this emulsion in a concentration of $10^{-7}$ (mole/mole of Ag), thereby doping the silver bromide grain with an Rh ion and an Ir ion. $Na_2PdCl_4$ was added in this emulsion, and the mixture was subjected to gold-sulfur sensitization with chloroauric acid and sodium thiosulfate. Thereafter, the resulting emulsion was coated together with a gelatin film-hardener in a coating amount of silver of 1 g/m² on a support made of polyethylene terephthalate (PET). On that occasion, an Ag/gelatin volume ratio was set up at 1/2.

The PET support used had a thickness of 90 μm and a width of 30 cm. The emulsion was coated in a width of 25 cm on the PET support having a width of 30 cm in a portion of 20 m, and the both ends of 3 cm were cut off so as to leave a central part of 24 cm of the coating, thereby obtaining a silver halide photosensitive material in a roll state.

(Exposure)

Exposure of the silver halide photosensitive material was carried out by using a continuous exposure unit in which exposure heads using DMD (digital mirror device) described in JP-A-2004-1244 are arranged in a width of 25 cm, the exposure heads and exposure stages are curved and disposed such that laser beams form an image on a photosensitive layer of the photosensitive material, a photosensitive material delivery mechanism and a take-up mechanism are installed, and bending having a buffer action such that tension control on the exposure surface and fluctuation in speed of the delivery mechanism and take-up mechanism do not influence the speed of the exposure portion is provided. A wavelength of the exposure was 400 nm; a beam form was a substantial square of 12 μm; and an output of the laser beam source was 100 μJ.

With respect to the pattern of exposure, lattice-like patterns having a line width of 8 μm were arranged at an angle of 45°, and pitches were continued at intervals of 300 μm in a width of 24 cm and a length of 10 m.

(Development Treatment)

| Formulation of one liter of developing solution (replenisher having the same composition) | |
|---|---|
| Hydroquinone | 22 g |
| Sodium sulfite | 50 g |
| Potassium carbonate | 40 g |
| Ethylenediaminetetraacetic acid | 2 g |
| Potassium bromide | 4 g |
| Polyethylene glycol 4000 | 1 g |
| Potassium hydroxide | 4 g |
| pH | adjusted at 10.2 |

| Formulation of one liter of fixing solution (replenisher having the same composition) | |
|---|---|
| Ammonium thiosulfate solution (75%) | 300 mL |
| Ammonium sulfite monohydrate | 25 g |
| 1,3-Diaminopropanetetraacetic acid | 8 g |
| Acetic acid | 5 g |
| Ammonia water (27%) | 1 g |
| pH | adjusted at 6.2 |

By using the foregoing treating agents, the exposed silver halide photosensitive material was developed at 33° C. for 40 seconds, fixed at 30° C. for 25 seconds and washed with running water (5 L/min) for 25 seconds by using a processor FG-710PTS, manufactured by FUJIFILM Corporation.

The running treatment was carried out for 3 days under conditions of a treatment amount of the photosensitive material of 100 m²/day, a replenishment amount of the developing solution of 500 mL/m² and a replenishment amount of the fixing solution of 640 mL/m².

There was thus prepared a film in which a silver mesh pattern was formed in a lattice-like form on the transparent film. This film had a surface resistivity of 45.2 Ω/sq.

(Plating Treatment)

The thus treated film having a silver mesh pattern formed thereon was electroplated by using an electroplating device in which plural tanks of a first stage represented by a plating tank 11 having substantially the same function and tank configuration as the electroplating tank 10 as illustrated in FIG. 1 and filled with a copper plating liquid A (15) and plural tanks of a second stage represented by a plating tank 19 having substantially the same function and tank configuration as the electroplating tank 10 as illustrated in FIG. 1 and filled with a copper plating liquid B (18) were continuously configured so as to have steps as described later and the plating tanks were connected so as to make it possible to carry out a treatment as described later. Incidentally, the film was installed in the electroplating device such that the silver mesh surface of the film was faced downwardly (the silver mesh surface was brought into contact with the feed rollers). The size of each of the plating tanks 11 and 19 was 80 cm×80 cm×80 cm in each bath.

Incidentally, a mirror-finished stainless steel-made roller (10 cmϕ, length=70 cm) was used as the feed rollers 12a, 12b; and a roller of 5 cmϕ having a length of 70 cm was used as the guide roller 14 and other delivery rollers. Furthermore, a height of the guide roller 14 was adjusted such that even when the line speed varies, a constant treatment time in the liquid can be ensured.

Furthermore, a distance between a lowermost part of a face where the feed roller 12a and the silver mesh surface of the film came into contact with each other in an inlet side and a plating liquid level (distance La as illustrated in FIG. 1) was adjusted at 9 cm; and a distance between a lowermost part of a face where the feed roller 12b and the silver mesh portion of the photosensitive material came into contact with each other in an outlet side and a plating liquid level (a distance Lb as illustrated in FIG. 1) was adjusted at 19 cm. Moreover, the line delivery rate was adjusted at 2.5 m/min.

A copper ball was used as the anode of the copper plating tank, and a carbon electrode was used as the anode of the blackening tank.

Compositions of the plating treatment liquids and rustproof liquid in the plating treatment are as follows.

| Composition of chemical treatment liquid (replenisher having the same composition) | |
| --- | --- |
| Glutaraldehyde | 20 g |
| Water to make | one liter |

A replenishment amount of the chemical treatment liquid was set up at 20 mL per 1 m² of the photosensitive material.

| Composition of copper plating liquid A (replenisher having the same composition) | |
| --- | --- |
| Copper sulfate pentahydrite | 220 g |
| Sulfuric acid (47%) | 220 mL |
| Hydrochloric acid (2 N) | 0.5 mL |
| Polyethylene glycol 4000 (average molecular weight: 4,000) | 0.4 g |
| Janus Green B | 0.05 g |
| Bis(3-sulfopropyl) disulfide | 0.05 g |
| Pure water to make | one liter |
| pH | −0.1 |

| Composition of copper plating liquid B (replenisher having the same composition) | |
| --- | --- |
| Copper sulfate pentahydrite | 200 g |
| Sulfuric acid (47%) | 200 mL |
| Pure water to make | one liter |
| pH | −0.1 |

A replenishment amount of each of the copper plating liquids A and B was set up at 40 mL per 1 m² of the photosensitive material.

| Blackening liquid | Tank liquid/Replenisher |
| --- | --- |
| Nickel sulfate hexahydrate | 120 g |
| Ammonium thiocyanate | 17 g |
| Zinc sulfate heptahydrate | See Table 2 |
| Sodium sulfate | 16 g |
| Pure water to make | one litter |
| pH | 5.0 (pH adjustment with sulfuric acid and sodium hydroxide) |

A replenishment amount of the blackening liquid was set up at 60 mL per 1 m² of the photosensitive material; and 0.6 N sodium hydroxide was separately added dropwise in a proportion of 20 mL per 1 m² of the photosensitive material.

| Rustproofing liquid | Tank liquid | Replenisher |
| --- | --- | --- |
| Benzotriazole | 2.0 g | 3.0 g |
| Methanol | 20 mL | 20 mL |
| Pure water to make | one litter | one liter |

A replenishment amount of the rustproofing liquid was set up at 100 mL per 1 m² of the photosensitive material.

The treatment time and applied voltage of each of the plating tanks are shown below. As the plating liquid of each of platings 1 to 8, the copper plating liquid A was used; and as the plating liquid of each of platings 9 to 16, the copper plating liquid B was used.

Furthermore, the treatment was carried out at a temperature of all of the copper plating liquids, washing waters, chemical treatment liquids and rustproofing liquids of from 25 to 30° C., a temperature of the blackening liquid of 45° C. and a drying temperature of from 50° C. to 70° C.

| | | | |
| --- | --- | --- | --- |
| Chemical treatment | 30 seconds | | |
| Water washing | 30 seconds | | |
| Water washing | 30 seconds | Drying | 30 seconds |
| Plating 1 | 30 seconds | Voltage | 20 V |
| Water washing | 30 seconds | | |
| Drying | 30 seconds | | |
| Plating 2 | 30 seconds | Voltage | 18 V |
| Water washing | 30 seconds | | |
| Drying | 30 seconds | | |
| Plating 3 | 30 seconds | Voltage | 17 V |
| Water washing | 30 seconds | | |
| Drying | 30 seconds | | |
| Plating 4 | 30 seconds | Voltage | 12 V |
| Water washing | 30 seconds | | |
| Drying | 30 seconds | | |
| Plating 5 | 30 seconds | Voltage | 10 V |
| Water washing | 30 seconds | | |
| Drying | 30 seconds | | |
| Plating 6 | 30 seconds | Voltage | 9 V |
| Water washing | 30 seconds | | |
| Drying | 30 seconds | | |
| Plating 7 | 30 seconds | Voltage | 8 V |
| Water washing | 30 seconds | | |
| Drying | 30 seconds | | |
| Plating 8 | 30 seconds | Voltage | 7 V |
| Water washing | 30 seconds | | |
| Drying | 30 seconds | | |
| Plating 9 | 30 seconds | Voltage | 5 V |
| Water washing | 30 seconds | | |
| Drying | 30 seconds | | |
| Plating 10 | 30 seconds | Voltage | 4 V |
| Water washing | 30 seconds | | |
| Drying | 30 seconds | | |
| Plating 11 | 30 seconds | Voltage | 4 V |
| Water washing | 30 seconds | | |
| Drying | 30 seconds | | |
| Plating 12 | 30 seconds | Voltage | 3 V |
| Water washing | 30 seconds | | |
| Drying | 30 seconds | | |
| Plating 13 | 30 seconds | Voltage | 3 V |
| Water washing | 30 seconds | | |
| Drying | 30 seconds | | |
| Plating 14 | 30 seconds | Voltage | 2 V |
| Water washing | 30 seconds | | |
| Drying | 30 seconds | | |
| Plating 15 | 30 seconds | Voltage | 2 V |
| Water washing | 30 seconds | | |
| Drying | 30 seconds | | |
| Plating 16 | 30 seconds | Voltage | 1 V |
| Water washing | 30 seconds | | |
| Drying | 30 seconds | | |
| Blackening treatment 1 | 45 seconds | Voltage | 6 V |

-continued

| | | | |
|---|---|---|---|
| Water washing | 30 seconds | | |
| Drying | 30 seconds | | |
| Blackening treatment 2 | 45 seconds | Voltage | 3 V |
| Water washing | 30 seconds | | |
| Drying | 30 seconds | | |
| Rustproofing | 45 seconds | | |
| Water washing | 30 seconds | | |
| Drying | one minute | 50° C. to 70° C. | |

With respect to each of the resulting film samples, the amount of each metal was determined in the following manner.

(Determination of Metal Amount in Sample)

10% nitric acid was prepared, and a fixed area (7 cm×3.5 cm) of the sample was immersed in 100 mL of this 10% nitric acid. The resulting sample was set in an ultrasonic device for about 2 hours, thereby completely extracting the metals in the sample. Thereafter, a concentration of each of the metals was determined by using an ICP light emission analyzer (manufactured by Shimadzu Corporation) to obtain a metal amount per 1 m² of the film sample. Silver, copper, nickel and zinc were determined as the metals, and a nickel/zinc mass ratio was obtained.

(Determination of Rustproofing Agent in Sample)

With respect to the extract used for the foregoing determination of metals, a concentration of the rustproofing agent was determined by using liquid chromatography to obtain an amount of the rustproofing agent per 1 m² of the film sample.

With respect to each of the thus prepared film samples, by properly changing the current density of the blackening treatment, the pH of the blackening liquid in each of the blackening treatment 1 and the blackening treatment 2, and the concentration of each of nickel sulfate, zinc sulfate and ammonium thiocyanate, samples with a varied ratio of nickel and zinc in the blackening layer were prepared. Each of the obtained samples was evaluated with respect to a defect and unevenness of the metal mesh film and change of color taste after elapsing under a wet heat condition and adhesion in the following manners. The results obtained are shown in Table 1.

(Defect of Metal Mesh Film)

A portion of a width of 5 cm of the center of the obtained sample was visually and microscopically observed over a length of 1 m, thereby observing a defect of the metal mesh. In that case, the "defect" as referred to herein refers to breaking of a wire of the metal mesh and hollows or foreign substances observed in an exposed portion of the metallic copper surface not covered by the blackening layer and a transparent film portion coming into contact with the metal mesh; the case where ten or more defects are observed is designated as "B", and the case where less than ten defects are observed is designated as "A".

(Unevenness of Metal Mesh Film)

A portion of a width of 5 cm of the center of the obtained sample was visually observed; and the case where unevenness is observed is designated as "B", and the case where unevenness is not observed is designated as "A".

(Change of Color Taste After Elapsing Under a Wet Heat Condition)

With respect to the color taste just after plating, a transmission spectrum was measured by a spectral photometer U3410, manufactured by Hitachi, Ltd., and a b* value of the L*b*c* coordinates under a CIE D65 standard light source on the basis of measured values was obtained and defined as b*(Fr). Next, this sample was stored under a constant temperature and humidity condition at 60° C. and 90% for 500 hours, and a b* value of the L*b*c* coordinates was again measured in the same manner and defined as b*(500 hr). Thus, a difference (Δb*) between the both measured values was obtained as the change of color taste during the high-temperature storage.

$$\Delta b^* = \{[b^*(500\ hr)] - [b^*(Fr)]\}$$

The smaller the Δb*, the smaller the change of color taste is, and therefore, such is preferable. When Δb* is larger than 3.0, the resulting film is improper for the use as an electromagnetic shielding film for PDP.

(Evaluation of Adhesion)

A cellophane adhesive tape (CT24, manufactured by Nichiban Co., Ltd.) was brought into intimate contact with the sample just after the plating treatment by the thick of a finger and then peeled away. The peeling state was visually confirmed.

A: Distinct peeling is partially observed.
B: Distinct peeling is entirely observed.

(Surface Resistivity Value)

With respect to each of the obtained samples, arbitrary ten places of the film sample except for a portion of 1 m from each of the forefront and the end were measured for surface resistivity in a series four probe (ASP) method by using LORESTA GP (Model: MCP-T610), manufactured by Dia Instruments Co., Ltd., thereby obtaining an average value thereof. From the standpoint of electromagnetic shielding properties, it is preferable that the surface resistivity value is not more than 0.4 Ω/sq.

(Total Light Transmittance)

A total light transmittance was measured according to JIS K7105 by using a haze meter NDH2000 (manufactured by Nippon Denshoku Industries Co., Ltd.). The larger the value, the higher the transmittance is, and therefore, such is preferable.

(Haze)

A haze was measured by using a haze meter NDH2000 (manufactured by Nippon Denshoku Industries Co., Ltd.). The smaller the value, the smaller the haze is, and therefore, such is preferable.

TABLE 1

| No. | Amount of nickel | Amount of zinc | Nickel/zinc mass ratio | Defect of metal mesh film | Unevenness of metal mesh film | Remark |
|---|---|---|---|---|---|---|
| 101 | 0.22 | 0.21 | 1.05 | A | A | Invention |
| 102 | 0.32 | 0.07 | 4.57 | A | A | Invention |
| 103 | 0.29 | 0.04 | 7.25 | A | A | Invention |
| 104 | 0.18 | 0.56 | 0.32 | B | B | Comparison |

As is clear from the foregoing Example, by decreasing the amount of zinc contained in the plating liquid for blackening treatment and decreasing the content of zinc in the blackening layer, the defect and unevenness of the metal mesh film were improved. In addition, in the Example, staining by a transparent deposit was reduced as compared with the Comparison.

Though the reasons why such effects were obtained are not elucidated, it is estimated that by decreasing the amount of zinc in the plating liquid, the plating efficiency increased; the generation of hydrogen was reduced; and transparent components peeled away from the film following this were decreased. As a result, the present inventor estimates that the staining by a transparent deposit was reduced.

As is clear from Table 1, in the samples of the invention in which the weight ratio of nickel and zinc falls within the range of from 0.5 to 50, the staining by a transparent deposit of the metal mesh film was small.

Also, the foregoing samples of the invention were small in the change of color tint after elapsing under a wet heat condition and excellent in the adhesion. Also, the samples of the invention have a surface resistivity value of not more than 0.4Ω/□, a total light transmittance of 80% or more and a haze of not more than 5% and can be suitably used as an electromagnetic shielding film for PDP.

EXAMPLE 2

Under the condition of Ni:Zn=7:1 in Example 1, the treatment was carried out by changing the anode of the blackening tank from the carbon electrode to a nickel electrode (by using 0.1N sulfuric acid for the pH adjustment) and using the following blackening liquid. As a result, defect and unevenness of the metal mesh film and staining by a transparent deposit were not observed at all; and in addition, the white stain of the film edge as observed in Example 1 was not observed at all.

EXAMPLE 3

In the sample after the electroplating treatment of Experiment 101 of Example 1, a protective film (Product No. HT-25, manufactured by Panac Industries, Inc.) having a total thickness of 28 μm was stuck on the surface of the PET support opposite to the metal mesh by using a laminator roller. Furthermore, a protective film (a trade name: SUNITECT Y-26F, manufactured by Sun A Kaken Co., Ltd.) having an acrylic adhesive layer stacked on a polyethylene film and having a total thickness of 65 μm was stuck in the side of the metal mesh by using a laminator roller.

Next, a glass plate having a thickness of 2.5 mm and an external size of 950 mm×550 mm was stuck onto the opposite surface of the PET support to the metal mesh as a sticking surface via a transparent acrylic adhesive material.

Next, an antireflection function-provided near infrared ray absorbing film (a trade name: CLEARAS AR/NIR, manufactured by Sumitomo Osaka Cement Co., Ltd.) made of a 100 μm-thick PET film, an antireflection layer and a near infrared ray absorber-containing layer was stuck on the inner metal mesh except for a peripheral part of 20 mm via an acrylic optically transparent adhesive material having a thickness of 25 μm. Incidentally, toning dyes (PS-Red-G and PS-Violet-RC, manufactured by Mitsui Chemicals, Inc.) for adjusting transmitting characteristics of an optical filter was contained in the subject acrylic optically transparent adhesive material layer.

In addition, an antireflection film (a trade name: REALOOK 8201, manufactured by NOF Corporation) was stuck onto a glass plate to prepare an optical filter.

Since the optical filters had a protective film-provided electromagnetic shielding film, they had extremely few scratches and defects of the metal mesh. Furthermore, the metal mesh was black so that the display image did not exhibit a metallic color. Moreover, each of the optical filters had an electromagnetic shielding ability and a near infrared ray cutting ability (transmittance at from 300 to 800 nm: not more than 15%) in levels in which a hindrance was not caused from the standpoint of practical use and was excellent in visibility due to the antireflection layer provided on the both surfaces thereof. In addition, by containing the dyes, a toning function could be imparted, and it was exhibited that each of the optical filters can be suitably used as an optical filter of plasma display or the like.

EXAMPLES a-1 TO 6 AND COMPARISONS a-1 TO 2)

A blackening layer having a desired Ni:Zn mass ratio was formed by changing the concentration of zinc sulfate heptahydrate of the plating liquid used in the blackening treatments 1 and 2 of No. 101. A conductive film was manufactured in the same manner as in No. 101 except for this treatment.

TABLE 2

|  | Ni:Zn mass ratio Blackening layer | Concentration of zinc sulfate heptahydrate (g/L) | | Generation of staining by a transparent deposit | Black tint |
| --- | --- | --- | --- | --- | --- |
|  |  | Plating liquid of blackening treatment 1 | Plating liquid of blackening treatment 2 |  |  |
| Example a-1 | 15:1 | 6 | 6 | 4 | Moderate |
| Example a-2 | 25:1 | 10 | 10 | 4 | Moderate |
| Example a-3 | 4.57:1 | 30 | 10 | 5 | Good |
| Example a-4 | 7.25:1 | 30 | 3.5 | 5 | Good |
| Example a-5 | 0.5:1 | 30 | 35 | 3 | Good |
| Example a-6 | 50:1 | 1 | 0.5 | 3 | Good |
| Comparison a-1 | 0.1:1 | 50 | 50 | 1 | Good |
| Comparison a-2 | 60:1 | 0.5 | 0.5 | 3 | Bad |

Evaluation of Generation of Staining by a Transparent Deposit:

5: Staining was not generated.

4: Staining was not substantially generated.

3: Staining was generated but was not problematic in practical use.

2: Staining was generated a little on the film.

1: Staining was generated on the film.

While the invention has been described in detail and with reference to specific embodiments thereof, it will be apparent to one skilled in the art that various changes and modifications can be made herein without departing from the spirit and scope thereof. The invention contains subjects related to a Japanese patent application (JP 2006-088538) filed on Mar. 28, 2006 and a Japanese patent application (JP 2006-167440) filed on Jun. 16, 2006, the entire contents of which being incorporated herein by reference.

The invention claimed is:

1. A transparent electromagnetic shielding film comprising:
   a transparent support; and
   a patterned conductive metal layer having an electromagnetic shielding ability and having a surface covered by a blackening layer,
   wherein the blackening layer contains an alloy of nickel and zinc in a nickel/zinc mass ratio of from 4.57 to 7.25.

2. The transparent electromagnetic shielding film according to claim 1,
   wherein a total amount of metals constituting the conductive metal layer is from 0.2 to 10.0 $g/m^2$.

3. The transparent electromagnetic shielding film according to claim 1,
   wherein a total sum of the alloy of nickel and zinc is from 0.06 to 5.0 $g/m^2$.

4. The transparent electromagnetic shielding film according to claim 1,
   wherein the metal constituting the conductive metal layer is silver and/or copper.

5. The transparent electromagnetic shielding film according to claim 4,
   wherein the conductive metal layer contains from 0.05 to 2.0 $g/m^2$ of silver and from 0.2 to 10 $g/m^2$ of copper; and
   the blackening layer contains from 0.06 to 2.0 $g/m^2$ of nickel and from 0.02 to 2.0 $g/m^2$ of zinc.

6. The transparent electromagnetic shielding film according to claim 1,
   wherein the nickel/zinc mass ratio is from 0.8 to 20.

7. The transparent electromagnetic shielding film according to claim 1,
   wherein the conductive metal layer is a two-layered configuration of a silver layer containing silver and a copper layer containing copper.

8. The transparent electromagnetic shielding film according to claim 1,
   containing from 0.03 to 0.3 $g/m^2$ of at least one member selected from benzotriazole, a benzotriazole derivative and a mercapto based compound;
   wherein the compound is contained in the conductive metal layer.

9. The transparent electromagnetic shielding film according to claim 1, containing gelatin;
   wherein gelatin is contained in the conductive metal layer.

10. The transparent electromagnetic shielding film according to claim 1,
    wherein the conductive metal layer comprises:
    a developed silver layer formed by exposing and developing a silver salt photosensitive material having a silver salt-containing layer which contains a silver salt on a support; and
    a metal layer formed on the developed silver layer by electroplating.

11. A conductive film comprising:
    a support film;
    a conductive metal layer formed on the support film; and
    a blackening layer formed on the conductive metal layer,
    wherein the blackening layer contains nickel and zinc, with a nickel/zinc mass ratio of from 4.57 to 7.25.

12. A manufacturing method of the conductive film comprising
    a step of exposing and developing a silver salt photosensitive material having a support film and a silver salt-containing layer formed on the support film so as to form a metallic silver part;
    a plating step of plating the metallic silver part so as to form a plating layer; and
    a blackening-layer-forming step of forming a blackening layer having a nickel/zinc mass ratio of from 4.57 to 7.25 on the plating layer by using a plating liquid containing nickel and zinc.

13. The manufacturing method of the conductive film according to claim 12,
    wherein the blackening layer is formed in two or more stages by using a first blackening plating liquid containing nickel and zinc and a second blackening plating liquid containing nickel and zinc; and
    a content ratio of nickel in the first plating liquid is larger than a content ratio of nickel in the second plating liquid.

14. The manufacturing method of the conductive film according to claim 13,
    wherein a content molar ratio of nickel and zinc in the first plating liquid satisfies the following formula (2):

$$Ni:Zn=10:1 \text{ to } 100:1 \qquad (2).$$

15. The manufacturing method of the conductive film according to claim 13,
    wherein a content molar ratio of nickel and zinc in the second plating liquid satisfies the following formula (3):

$$Ni:Zn=1:1 \text{ to } 20:1 \qquad (3).$$

* * * * *